United States Patent
Ozgur et al.

(10) Patent No.: US 11,049,725 B1
(45) Date of Patent: Jun. 29, 2021

(54) METHOD FOR ETCHING DEEP, HIGH-ASPECT RATIO FEATURES INTO SILICON CARBIDE AND GALLIUM NITRIDE

(71) Applicant: Corporation for National Research Initiatives, Reston, VA (US)

(72) Inventors: Mehmet Ozgur, Reston, VA (US); Michael Pedersen, Ashton, MD (US); Michael A. Huff, Oakton, VA (US)

(73) Assignee: CORPORATION FOR NATIONAL RESEARCH INITIATIVES, Reston, VA (US)

( * ) Notice: Subject to any disclaimer, the term of this patent is extended or adjusted under 35 U.S.C. 154(b) by 1217 days.

(21) Appl. No.: 14/290,317

(22) Filed: May 29, 2014

(51) Int. Cl.
*H01L 21/311* (2006.01)
*H01L 21/3065* (2006.01)
(Continued)

(52) U.S. Cl.
CPC ...... *H01L 21/3065* (2013.01); *H01L 21/0332* (2013.01); *H01L 21/76898* (2013.01); *H01L 29/1608* (2013.01); *H01L 29/2003* (2013.01)

(58) Field of Classification Search
CPC .......... H01L 21/0332; H01L 21/76898; H01L 21/31116; H01L 21/31144; H01L 29/1608;
(Continued)

(56) References Cited

U.S. PATENT DOCUMENTS

| 5,001,085 | A | * | 3/1991 | Cathey | ................ H01L 21/3065 |
| | | | | | 148/DIG. 105 |
| 6,277,763 | B1 | * | 8/2001 | Kugimiya | ................ C23F 4/00 |
| | | | | | 156/345.33 |

(Continued)

OTHER PUBLICATIONS

Beheim "Deep Reactive Ion Etching for Bulk Micromachining of Silicon Carbide" The MEMS Handbook, ed. By M. Gad-el-Hak, CRC Press Boca Raton, FL, pp. 21.1-21.12 (2002).

(Continued)

*Primary Examiner* — Duy T Nguyen
(74) *Attorney, Agent, or Firm* — Nixon & Vanderhye P.C.

(57) ABSTRACT

A method for the etching of deep, high-aspect ratio features into silicon carbide (SiC), gallium nitride (GaN) and similar materials using an Inductively-Coupled Plasma (ICP) etch process technology is described. This technology can also be used to etch features in silicon carbide and gallium nitride having near vertical sidewalls. The disclosed method has application in the fabrication of electronics, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride. The disclosed method also has application in the fabrication of through-substrate vias
(Continued)

and through-wafer vias, including those that are subsequently filled with electrically conductive materials.

87 Claims, 15 Drawing Sheets

(51) Int. Cl.
*H01L 21/033* (2006.01)
*H01L 21/768* (2006.01)
*H01L 29/16* (2006.01)
*H01L 29/20* (2006.01)

(58) Field of Classification Search
CPC .... H01L 29/2003; H01L 21/32136–21/32137;
H01L 21/3065–21/30655; H01L 21/3116;
H01L 21/31122; H01L 21/31138; H01L
23/488; H01L 23/147; H01L 24/05; H01L
2224/131; H01L 2224/1703; H01L 24/17;
H01L 24/16; H01L 24/81; H01L
2224/81447; H01L 23/562; H01L
2224/8114; H01L 2224/81191; H01L
2224/81203; H01L 2224/81192; H01L
2224/16238; H01L 2224/10165; H01J
37/3211; H01J 2237/334–2237/3348;
H01J 37/321; H01J 37/32366; H01J
37/32376; H01J 37/32385; H01J
2237/3341; C03C 15/00; B81C 1/00619
USPC ...................... 438/700, 702, 710; 216/67, 68
See application file for complete search history.

(56) References Cited

U.S. PATENT DOCUMENTS

| | | | | |
|---|---|---|---|---|
| 8,530,353 | B2 * | 9/2013 | Hirooka .................. | C30B 29/36 216/58 |
| 8,778,715 | B2 * | 7/2014 | Bellinger ................ | H01L 31/18 257/E21.483 |
| 2002/0170678 | A1 * | 11/2002 | Hayashi ................. | H01J 37/321 156/345.48 |
| 2003/0168428 | A1 * | 9/2003 | Kouchiyama ............ | G11B 7/26 216/24 |
| 2003/0228768 | A1 * | 12/2003 | Chae ................... | H01L 21/31144 438/710 |
| 2004/0170019 | A1 * | 9/2004 | Tamai ................... | F21K 9/00 362/247 |
| 2005/0101100 | A1 * | 5/2005 | Kretchmer ......... | H01L 21/76224 438/424 |
| 2007/0001267 | A1 * | 1/2007 | Ayazi ................... | B81C 1/00531 257/622 |
| 2008/0292976 | A1 * | 11/2008 | Terasaki ................ | B82Y 10/00 430/5 |
| 2009/0001478 | A1 * | 1/2009 | Okamoto .......... | H01L 21/76898 257/382 |
| 2009/0104738 | A1 * | 4/2009 | Ring ................. | H01L 21/76898 438/172 |
| 2009/0139540 | A1 * | 6/2009 | Lau ........................... | B08B 7/00 134/1.1 |
| 2009/0191715 | A1 * | 7/2009 | Hayashi ............ | H01L 21/31116 438/710 |
| 2009/0272982 | A1 * | 11/2009 | Nakamura ........ | H01L 29/66848 257/77 |
| 2009/0314636 | A1 * | 12/2009 | Ishikawa ................. | C23C 14/35 204/298.16 |
| 2010/0084327 | A1 * | 4/2010 | Goranson ................ | B01J 47/02 210/198.2 |
| 2011/0012155 | A1 * | 1/2011 | Huang ................ | H01L 33/0095 257/98 |
| 2012/0031561 | A1 * | 2/2012 | Kim .................. | H01J 37/32091 156/345.48 |
| 2012/0149213 | A1 * | 6/2012 | Nittala .................... | C23C 16/02 438/783 |
| 2014/0072830 | A1 * | 3/2014 | Lille ...................... | G11B 5/855 428/847 |
| 2014/0097153 | A1 * | 4/2014 | Ashraf ...................... | C23F 1/12 216/51 |
| 2014/0166618 | A1 * | 6/2014 | Tadigadapa ....... | H01J 37/32357 216/67 |
| 2014/0199359 | A1 * | 7/2014 | Chason .................. | A01N 55/02 424/409 |
| 2014/0302678 | A1 * | 10/2014 | Paterson ............. | H01L 21/3065 438/700 |
| 2014/0302680 | A1 * | 10/2014 | Singh .................. | H01L 21/3065 438/710 |
| 2015/0008444 | A1 * | 1/2015 | Derluyn ................ | H01L 29/205 257/76 |
| 2015/0034592 | A1 * | 2/2015 | Huff ..................... | H01J 37/3211 216/41 |

OTHER PUBLICATIONS

Cree "GaN MMIC Foundry Service" Brochure available on Cree web site at: http://www.cree.com/products/MMIC.asp.
Evans et al. "Deep Reactive Ion Etching (DRIE) of High Aspect Ratio sic Microstructures Using a Time-Multiplexed Etch-Passivate Process" Material Science Forum, 527-529:1115-1118 (Oct. 2006).
Mehregany et al. "Silicon Carbide MEMS for Harsh Environments" Proc. IEEE 86:1594-1610 (1998).
Okamoto et al. "SiC Backside Via-Hole Process for GaN HEMT MMICs Using High Etch Rate ICP Etching" CS ManTech Conference, May 18-21, 2009, Tampa, Florida.
Shor et al. "Photoelectrochemical Etching of 6H-SiC" J. Electrochem. Soc., 141:778-781 (1994).
Yasseen et al. "Surface Micromachining of Polycrystalline SiC Films Using Microfabricated Molds of SiO2 and Polysilicon" J. MEMS 8:237-242.
Yih et al. "A Review of SiC Reactive Ion Etching in Fluorinated Plasmas" Phys. Stat. Sol. 202:605-642 (1997).

* cited by examiner

110 

| Etch Process Parameter | Units of Process Parameter |
|---|---|
| Radio Frequency (RF) Bias Power | Watts |
| Substrate chuck temperature | Degrees-Celsius |
| O2 gas flow | Standard Cubic Centimeters per Minute (sccm) |
| Chamber pressure | Milli-Torr |
| SF6 gas flow | Standard Cubic Centimeters per Minute (sccm) |
| Etch cycle time | Hours, Minutes, Seconds |
| O2 clean cycle time | Hours, Minutes, Seconds |
| Radio Frequency (RF) antenna power | Watts |
| Top magnet current | Amps |
| Center magnet current | Amps |
| Bottom magnet current | Amps |
| Heat shield temperature | Degrees-Celcius |
| He cooling pressure | Pascals |
| Chamber cleaning history | Number of wafers etched between cleans |

Figure 9

*DOE wafer metrology parameters* — 120

| Parameter | Parameter name | Derived from |
|---|---|---|
| A | Initial etch mask thickness | Optical profilometry 10 points per wafer |
| B | Silicon Carbide etch depth | Cross-section analysis |
| C | Etch mask top lateral erosion variation | Optical microscopy Std deviation/Average 30 points per wafer |
| D | Silicon Carbide etch rate | "B" divided by etch time |
| E | Mask selectivity | "B" divided by "F" |
| F | Etch mask vertical etch rate | Optical profilometry & SEM analysis divided by etch time |
| G | Etch mask horizontal etch rate | Optical microscopy divided by etch time |
| H | Etch mask Horizontal/Vertical etch rate | "G" divided by "F" |
| I | Etch removed @ bottom of mask | SEM analysis |
| J | Polymer thickness | SEM analysis |
| K | Top-to-center sidewall angle | Cross-section analysis |
| L | Center-to-bottom sidewall angle | Cross-section analysis |
| M | Top-to-bottom sidewall angle | Cross-section analysis |
| N | Top hat depth | Cross-section analysis |
| O | Top hat width | Cross-section analysis |
| P | Top hat slope | Cross-section analysis |
| Q | Etch depth uniformity | Cross-section analysis |
| R | Etch quality | Optical microscopy |

Figure 10

METHOD FOR ETCHING DEEP, HIGH-ASPECT RATIO FEATURES INTO SILICON CARBIDE AND GALLIUM NITRIDE

FIELD OF INVENTION

The present invention is directed to a method for the etching of deep, high-aspect ratio features into silicon carbide (SiC), gallium nitride (GaN) and similar materials using an Inductively-Coupled Plasma (ICP) etch process technology. This technology can also be used to etch features in silicon carbide and gallium nitride having near vertical sidewalls. The method of the present invention has application in the fabrication of electronics, passive electronic devices, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride. The present invention also has application in the fabrication of through-substrate vias and through-wafer vias including those that are subsequently filled with electrically conductive materials.

BACKGROUND OF THE INVENTION

Deep, high-aspect ratio etching has become a mainstay of the semiconductor industry in the formation of deep and high-aspect ratio features into substrates. However, nearly all of the deep, high-aspect ratio etch development performed to date has been limited to silicon substrates using what is called Deep, Reactive-Ion Etching, or DRIE technology. Recently, through-substrate via (TSV) technology requiring very high-aspect ratio through-silicon wafer etches using DRIE has also become an important emerging technology for higher scaling and packaging densities in the pursuit of higher performance, lower cost microelectronic integrated circuits (ICs), microsystems, 3-D microelectronics, and heterogeneous 3-D integration solutions.

A very important semiconductor substrate material system for the implementation of electronics, passive electronic devices, microelectronics, power electronics, Monolithic Microwave Integrated Circuits (MMICs), high-voltage electronics, high-temperature electronics, high-power electronics, light-emitting diodes (LEDs), micro-electro-mechanical systems (MEMS), micro-mechanical devices and systems, microelectronic devices and systems, nanotechnology devices and systems, nano-electro-mechanical systems (NEMS), photonic devices, and several other semiconductor devices is Silicon Carbide (SiC). There exist several very important commercial applications that are in need of an etching technology that can be used to etch deep, high-aspect ratio features into bulk SiC substrates, similar to what is done with silicon using DRIE.

Moreover, there are several important commercial applications in need of an etching technology that can be used to etch deep, high-aspect ratio features into Gallium Nitride (GaN) layers on silicon carbide as well. For example, etched backside via holes that are etched through both a SiC substrate and a GaN layer are considered a key technology in realizing GaN High-Electron-Mobility Transistor (HEMT) MMICs for millimeter-wave high-power amplifiers.

However, SiC is an extremely difficult material to plasma etch due to the strong energy of the Si—C bond, and as a consequence, very little work has been performed in developing this type of etch capability. Furthermore, the work that has been performed has limited useful application due to slow etch rates, defects in the etched features, limited etch depths and small aspect ratios, etc. Consequently, this type of important and needed plasma etch capability is currently not available to fabricators or designers interested in developing SiC-based devices or GaN-based devices on SiC substrates for many important commercial applications.

A "silicon-DRIE-like" process for deep, high-aspect ratio etching of bulk SiC would provide an enormous improvement compared to currently employed wet and dry etching methods for SiC device fabrication. Some of the important application areas in need of a deep, high-aspect ratio etch technology for SiC, and GaN layers on SiC layers if present, include: a). SiC MEMS and Microsystems; b). Thermal Management of SiC and GaN on SiC-based devices; c). GaN on SiC-based RF MMIC, power electronics, and Optoelectric Devices; d). GaN on SiC-based sensors; e). GaN on SiC-based LEDs and laser diodes; and f). SiC-based high-voltage, high-power and/or high-temperature electronics. Each of these areas has important applications in the commercial sectors and would enormously benefit from the availability of a deep, high-aspect ratio plasma etch technology for SiC and/or GaN on SiC. Moreover, some of these application areas will also benefit enormously from a process that can be used to make Through-Substrate-Vias (TSVs).

Silicon Carbide has many very desirable material properties, including: a large semiconductor band-gap, high stiffness, chemical inertness, high thermal stability, low thermal expansion, exceptionally good thermal shock resistance, high thermal conductivity, and many others, making it an excellent material choice for many semiconductor device applications. Specifically, SiC is a semiconductor material having application in high-temperature and/or high-voltage power electronic devices as well as sensors, including MEMS and micro-sensors, for high-temperature and/or harsh environments. Additionally, SiC has application in some photonic applications as well. Some of the examples of Silicon Carbide applications are provided below:

Power Electronic Devices:

Silicon carbide provides significant advantages for fast, high-temperature and/or high-voltage devices. Some of the first SiC devices available were Schottky diodes, followed by Junction-gate Field-Effect Transistors (FETs) and Metal-Oxide Field-Effect Transistors (MOSFETs), which have application in high-power switching. Additionally, SiC bipolar transistors and thyristors are also useful for power electronics. The first commercial JFETs rated at 1200 V were recently introduced to the market, followed by the more recent introduction of commercial MOSFETs rated at 1200 V.

Beside SiC switches and SiC Schottky diodes (also Schottky barrier diode or SBD), companies have also implemented the non-packaged SiC integrated circuits into their power modules. SiC SBD diodes found wide market spread being used in Power Factor Correction (PFC) circuits and Insulated-Gate Bipolar Transistor (IGBT) power modules.

LEDs:

Yellow-colored LEDs made from SiC were manufactured in the 1970s, and blue-colored LEDs, also made from SiC, were introduced in the 1980s. However, the production of SiC LEDs was soon stopped because gallium nitride (GaN) showed 10-100 times brighter emission. This difference in efficiency is due to the fact that SiC has an indirect bandgap, whereas GaN is a direct bandgap material, which favors light emission. However, SiC is still very important in the LED market as a substrate material wherein GaN is grown on top of a SiC substrate in the fabrication of GaN devices. Additionally, SiC has excellent thermal conductivity thereby making it an excellent material to serve as a heat spreader in high-power devices.

In the case of MMICs, both microstrip and backside-grounded coplanar waveguide circuit implementations of RF circuits require through-substrate-vias to either provide microwave short circuits or to equalize upper and lower ground planes of coplanar waveguides. Historically, in commercial applications due to the high cost of making vias in SiC material substrates, there has been tremendous pressure to minimize the need for grounding or achieve grounding through other means such as wire-bonding or flip-chip bonding. Although such via-less processes and designs are commercially available, they sacrifice the ultimate performance level of the transistors to achieve a minimally acceptable performance level. Importantly, there is great need of a technology for relatively low cost via formation, so that it can become a standard part of fabrication technologies. Therefore, a deep, high-aspect ratio dry-plasma RIE etching technology performed on a commercial etching system can significantly lower the cost of via formation and would be very desirable. Furthermore, advanced and commercial-like etching technologies combined with other commercial-like processes can be used to make high-performance Through-Substrate-Vias (TSVs) in GaN on SiC substrates. GaN on SiC technology has been in great need of a state-of-the art via-etch technology to provide the best device and system performance.

The availability of making deep, high-aspect ratio etched features and vias will also improve the design practices for more reliable and consistent passive components on MMICs and similar circuits. For example, distributed transmission line elements (couplers, edge-coupled filters, stubs, transmission line transformers, etc.) require predictable and consistent circuit terminations. Vias are also essential in the operation of the majority of the active components, because most amplifier designs require the source or the emitter of the transistor (e.g., High-Electron Mobility Transistor [HEMT], Field-Effect Transistor [FET] or Heterogeneous Bipolar Transistor [HBT]) be grounded. Ideally, this would be done with through-substrate-vias. However, these have not been possible previously due to the unavailability of a suitable deep, high-aspect ratio etch technology. Yet another benefit of source vias is the fact that the output stages of power amplifiers have very large transistors, which require challenging matching networks. These large transistors are typically grounded by two large source vias on each side. However, the size of the vias is limited by the previously available low-aspect ratio and costs of via fabrication technology. Moreover, the large, low-aspect ratio vias that have been available dominated the layout area and therefore resulted in inefficient use of the expensive die area, thereby resulting in higher costs. In short, a deep, high-aspect ratio etching technology will radically increase performance and lower costs of important RF systems.

As mentioned above, to date, the advancement of SiC etching has been very limited. There has been some notable work on surface micromachining technology of thin-film deposited SiC for the implementation of MEMS sensors[1]. However, the aspect ratio of the devices that can be implemented using surface micromachining technologies is very limited (i.e., less than 1) and the type of devices that can be implemented is extremely constrained. Importantly, the SiC material used in this fabrication approach is deposited using Chemical-Vapor Deposition (CVD) methods, and consequently, the resultant material's structure is polycrystalline thereby making it unsuitable for the vast majority of electronic applications as well as many sensor applications.

[1] Mehregany, M., et al., "Silicon Carbide MEMS for Harsh Environments," Proc. IEEE 86, pp. 1594-1610.

Electrochemical wet etching of SiC has been reported for bulk SiC substrates[2]. While this technique allows deep etching into single-crystal SiC substrates, it suffers from several severe disadvantages. Specifically, wet electrochemical etching results in significant lateral etching thereby making it impossible to control the lateral dimensions of the device. Additionally, this technique necessitates complicated approaches to protect already-existing elements on the substrate from destruction while being immersed into the aggressive wet etchant solution. Clamping jigs or spun-on protective layers are difficult to use, do not work very well, and result in significant yield losses. They also add very significantly to the cost of the fabrication process. In short, they are not suitable for manufacturing.

[2] Shor, J. S., and Kurtz, A. D., "Photoelectrochemical Etching of 6H—SiC," J. Electrochem. Soc., 141, pp. 778-781.

Micromolding has also been used for making modest aspect ratio structures in SiC[3]. The approach uses RIE etching of a silicon dioxide or polysilicon film on a substrate to form a mold. The mold is then filled with a CVD deposition of SiC material and subsequently the silicon mold is removed. This process approach has many shortcomings. Firstly, like surface micromachining of SiC, micromolding uses CVD deposited SiC and therefore the material has a polycrystalline structure making it unsuitable for most electronic semiconductor device applications. Secondly, the aspect ratio of this approach is very limited due to the difficulty of filling high aspect ratio features by CVD deposition. Thirdly, it is complicated and expensive.

[3] Yasseen, A. A., et al., "Surface Micromachining of Polycrystalline SiC Films Using Microfabricated Molds of SiO2 and Polysilicon," J. MEMS 8, pp. 237-242.

Recently, Beheim and others have reported on using RIE and DRIE etch processes to fabricate relatively deep features in SiC[4,5]. However, the reported etch depths in literature are all limited to 10's of microns and aspect ratios of less than 2. Moreover, the etch rate, mask selectivity and defects, especially pillar formation, in the etch process were very problematic for high-fidelity, deep and high-aspect ratio etching. A review of the use of DRIE etching of SiC wherein these same process limitations were reported has been published in the literature[6].

[4] L. J. Evan and G. M. Beheim, "Deep Reactive Ion Etching (DRIE) of High Aspect Ratio SiC Microstructures Using a Time-Multiplexed Etch-Passivate Process," Material Science Forum, Vol. 527-529, October 2006, pp. 1115-1118.

[5] G. Beheim, "Deep reactive ion etching of silicon carbide," The MEMS Handbook, ed. By M. Gad-el-Hak, CRC Press Boca Raton, Fla., 2002, pp, 21.1-21.12.

[6] P. H. Yih, V. Saxena, and A. J. Steckl, "A Review of SiC Reactive Ion Etching in Fluorinated Plasmas," Phys. stat. sol. (b), vol. 202, no. 1, pp. 605-642, 1997.

More recently, there has been increased interest in plasma etching of SiC backside via holes for through-substrate electrical connections, which is widely considered a key technology in realizing GaN High-Electron Mobility Transistor (HEMT) MMICs for millimeter-wave high-power amplifiers[7]. However, the current technology competes unfavorably with high-rate laser drilling and to date, plasma via etching has not been considered a competitive approach. This is due to a number of factors that have limited dry plasma via etching in SiC, including: the etch rates are very slow making the process extremely expensive; many of the process recipes reported to date exhibit severe defect formation mostly in the form of pillars, micro-masking and micro-trenching effects; significant RIE lag effects are seen; and loading effects are pronounced and etch uniformities are poor. All of the work reported to date performed the etching experiments on the STS Multiplex ICP DRIE silicon etcher that is commonly employed for DRIE etching of silicon. Cree recently announced a GaN MMIC Foundry Service using through-substrate vias to make electrical contact to the devices. However, the aspect ratio is 2 to 1 and therefore the device sizes are large and the substrates must be thinned to extreme levels[8].

[7] N. Okamoto, et al., "SiC Backside Via-Hole Process for GaN HEMT MMICs Using High Etch Rate ICP Etching," CS ManTech Conference, May 18-21, 2009, Tampa, Fla.

[8] Cree GaN MMIC Foundry Service Brochure available on Cree web site at: http://www.cree.com/products/MMIC.asp.

Consequently, there is a significant need for a deep, high-aspect ratio plasma etching process for Silicon Carbide (SiC) material and substrates that can be performed using a production-type etch system. While plasma etching of silicon carbide has been around for a few years, this technology has been limited to depths of a few tens of microns or less, very limited aspect ratios, and typically non-vertical sidewalls of the etched features. Consequently, the ability to make deep, small-dimensioned devices and device features with high aspect ratios and vertical etched sidewalls into silicon carbide materials and substrates has not been available until the invention disclosed herein and as discussed above, there is a great need for such an etch technology in several important commercial sectors. Additionally, there is a significant need for a deep, high-aspect ratio etching process for GaN material layers and substrates, specifically for GaN layers on SiC substrates.

SUMMARY OF INVENTION

The present invention is directed to a method for the etching of deep, high-aspect ratio features into silicon carbide (SiC), and gallium nitride (GaN) on silicon carbide, and similar materials using an Inductively-Coupled Plasma (ICP) etch process technology. This technology can also be used to etch features in silicon carbide and gallium nitride on silicon carbide having near vertical sidewalls. The method of the present invention has application in the fabrication of electronics, passive electronic devices, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride on silicon carbide. The present invention also has application in the fabrication of through-substrate vias and through-wafer vias including those that are subsequently filled with electrically conductive materials.

BRIEF DESCRIPTION OF THE DRAWINGS

FIG. 9 is a table of the etch parameters of the etch process described herein.

FIG. 10 is a table of process characteristics derived from metrology of etched structures in the design-of-experiments (DOE) described herein.

DETAILED DESCRIPTION OF THE INVENTION

The present invention is directed to a method for the etching of deep, high-aspect ratio features into silicon carbide (SiC), gallium nitride (GaN) on silicon carbide, and similar materials using an Inductively-Coupled Plasma (ICP) etch process technology. This technology can also be used to etch features in silicon carbide and gallium nitride having near vertical sidewalls. The method of the present invention has application in the fabrication of electronics, passive electronic devices, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride. The present invention also has application in the fabrication of through-substrate vias and through-wafer vias including those that are subsequently filled with electrically conductive materials.

The present invention is directed to a method (i.e., process recipe) that can be used to etch deep and high-aspect ratios features with near vertical sidewalls into material layers or substrates comprised of silicon carbide or gallium nitride on silicon carbide. The method of the present invention is performed on an inductively-coupled plasma (ICP) reactive-ion etcher (RIE) system, which is a type of tool platform commonly used in semiconductor device manufacturing.

Figure 1:
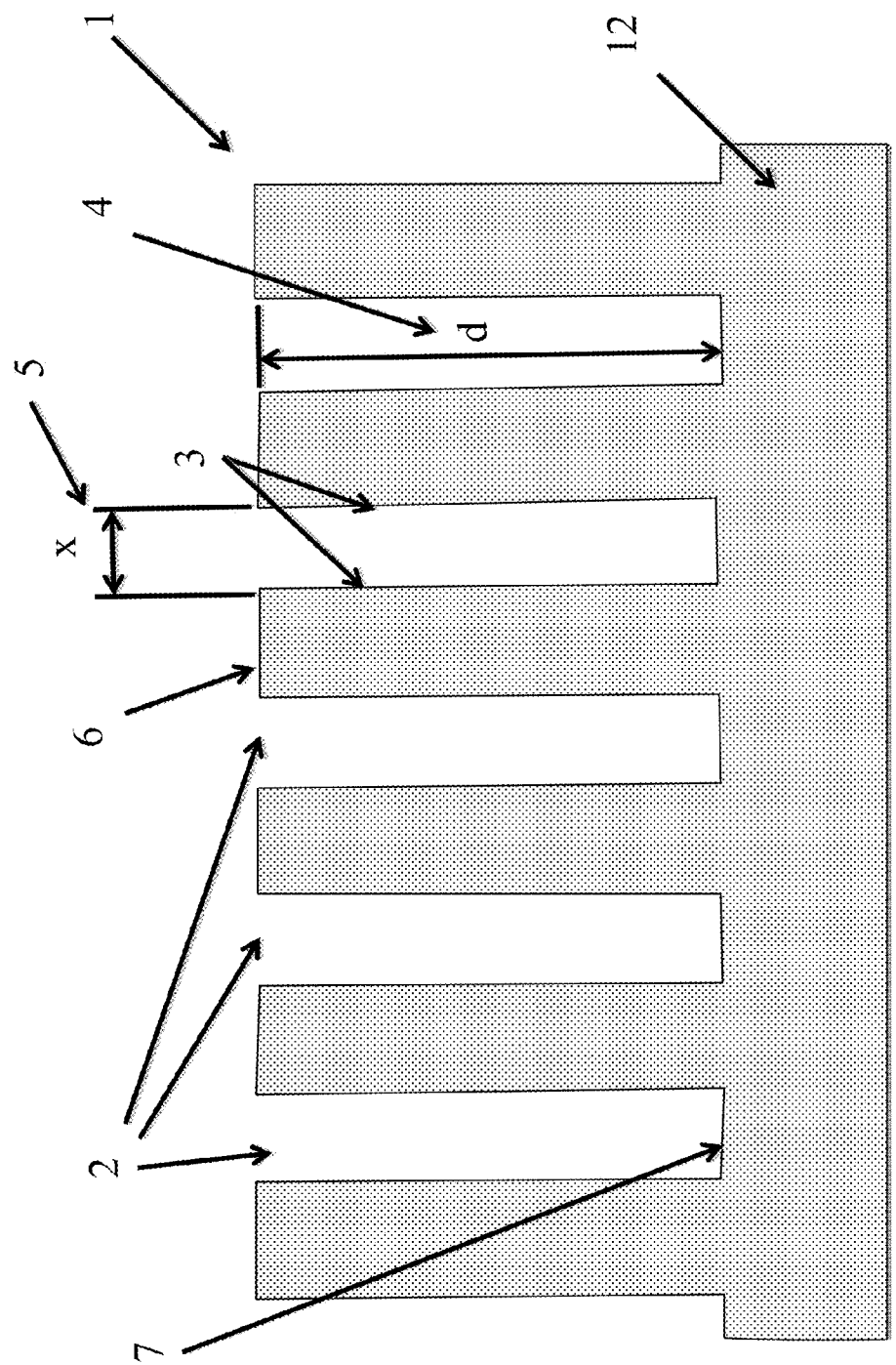
FIG. 1 is an illustration of a deep, high-aspect ratio feature etched into the materials, and using the method described herein.

FIG. 1 illustrates one result of the etching method of the present invention. A cross-section 1 of a section of a substrate 12 is shown in the FIG. 1. Also shown in FIG. 1 are a number of high-aspect ratio trenches 2 that have nearly vertical sidewalls 3. An etch that results in vertical or near vertical sidewalls 3 of one or more etched trenches 2 is often desirable and is regarded as having higher anisotropy compared to sidewalls that are sloping. Therefore, the result shown in FIG. 1 would be considered as a "highly anisotropic etch" result and would be very desirable for many commercial applications. A vertical sidewall is defined as a wall with an angle of 90 degrees with respect to the etch plane. A nearly vertical sidewall is defined as a wall with an angle that is within two (2) degrees of 90-degrees with respect to the etch plane. The depth 4 of the etched trenches 2 is given by the measurement from the top unetched portion 6 of the substrate 12 to the bottom 7 of the etched trenches 2 and is represented by depth 4 of d. The aspect ratio of these etched trenches 2 in this example etch result 1 is given by the ratio of the depth 4 of the etched trenches 2 and the width 5 of the trenches 2 given by x, or:

Aspect Ratio=$d/x$.

It is important to note that an etch method that can provide higher aspect ratios is highly preferable since it enables more design and process flexibility for the fabrication of devices and structures in silicon carbide or gallium nitride on silicon carbide. A high-aspect ratio is an Aspect Ratio that is equal to or greater than two (2).

Although the etcher system design is not the basis of the present invention, it is worth reviewing the etcher system that can be used to perform the method of the present invention.

Figure 2:
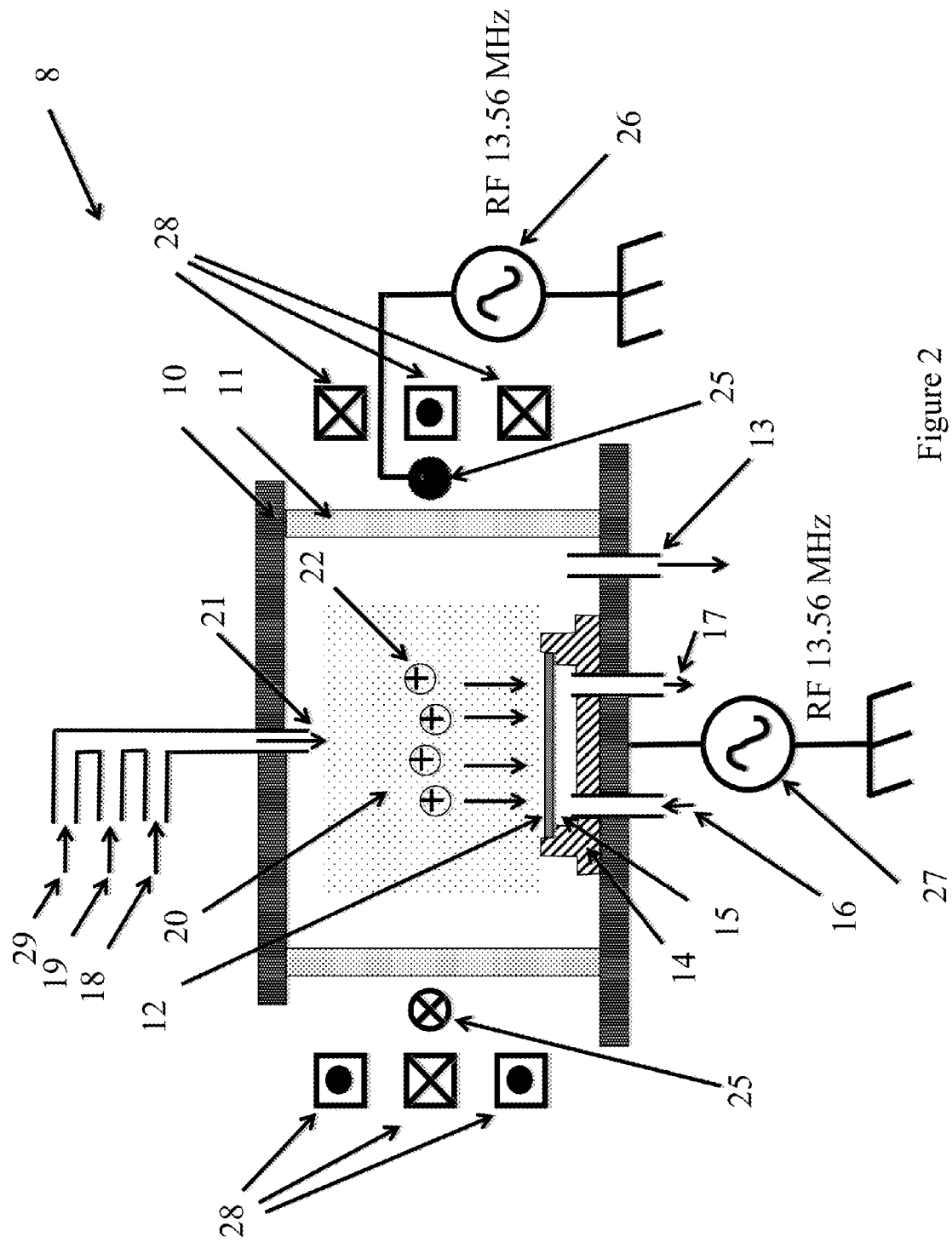
FIG. 2 is an illustration of the plasma etching system that uses the method of etching the materials described herein.

The basic diagram of the Inductively-Coupled Plasma (ICP) etcher system 8 is illustrated in FIG. 2. This etch system 8 uses a chemically reactive gas plasma 20 that impinges on the surface of the substrate 12 to remove material from the substrate 12 that is being etched. A typical system configuration 8 employs an etch chamber 10 that includes a quartz vessel 11. The etch chamber 10 is connected through tubing 13 to a vacuum pump (not shown) so as to lower the pressure inside the chamber 10 below that of ambient pressure. The substrate 12 being etched is positioned on a chuck 14 that uses active cooling on the backside of the substrate 12 in order to control the temperature of the substrate 12 during etching. The actively cooled chuck 14 has a central cavity 15 where Helium gas is supplied to the cavity through an inlet port 16 and flows through the chuck cavity 15 to allow efficient heat transport from the substrate 12 to the Helium gas flowing through the cavity 15 in the chuck 14.

Controlled amounts of process gases, including Sulfur Hexafluoride ($SF_6$) 18 and Oxygen ($O_2$) 19, are introduced into the process etch chamber 10 through a gas inlet port 21 and a plasma 20 is generated by the interaction of the gases 18 and 19 with an applied Radio Frequency (RF) electromagnetic field created by a Radio Frequency (RF) coil 25 operating at a frequency of 13.56 MHz that is connected to a RF generator 26. Controlled amounts of an additional process gas that is Argon (Ar) 29 may also be introduced into the etch chamber 10 and also be initiated into a plasma 20 for specific desired etch results. The RF coil 25 completely encircles the etch chamber 10 and is positioned outside the etch chamber 10. High-energy ions 22 from the plasma 20 are accelerated to strike the substrate 12 surface by a separate Radio Frequency (RF) electromagnetic field created by a second RF generator 27 operating at 13.56 MHz frequency that is connected to the chuck 14 on which the substrate 12 is positioned during etching. Gases 18 and 19, and 29 if used, exit the process chamber 10 under the action of a vacuum pump connected to exit port 13. The types and amounts of gases 18, 19 and 29 used in an etch process depend on substrate 12 material being etched, as well as other desired process outcomes. The flow rates of these process gases 18, 19 and 29 are controlled by in-line mass flow controllers (not shown), which are standard in the industry.

Inductively-Coupled Plasma (ICP) etchers 8 are a subcategory of RIE etch systems that achieve very high plasma 20 densities due to the plasma 20 being generated by a Radio Frequency (RF) electromagnetic field created by the external antenna 25 that is connected to a RF generator 26. When an Inductively-Coupled Plasma (ICP) etcher 8 is configured with a separate Radio Frequency (RF) electromagnetic field created by a RF generator 27 that is connected to the chuck 14 on which the substrate 12 is positioned during etching, high plasma 20 densities, low electron temperatures, low chamber 10 process pressures, and high levels of etch anisotropy in the substrate 12 surface can be obtained. For the etching system 8 used in the present invention, a high plasma density is defined as one above $1.2 \times 10^{11}$ $cm^{-3}$, a low electron temperature is defined as below 4 eV, and a low chamber process pressure is defined as well below 2.67 Pascals. However, it should be noted that these plasma densities, electron temperatures, and process chamber pressures may vary depending on the exact tool configuration and that these are only guidelines.

The ICP etcher 8 may also use an electromagnetic neutral loop comprised of magnetic coils 28, which enables spatial redistribution of ions 22 in the plasma 20 to enhance etching uniformity across the substrate.

FIGS. 3a-3d, 4a-4d, 5a-5d and 6a-6d illustrate some of the substrate configurations that can be etched by the method of the present invention.

Figure 3:
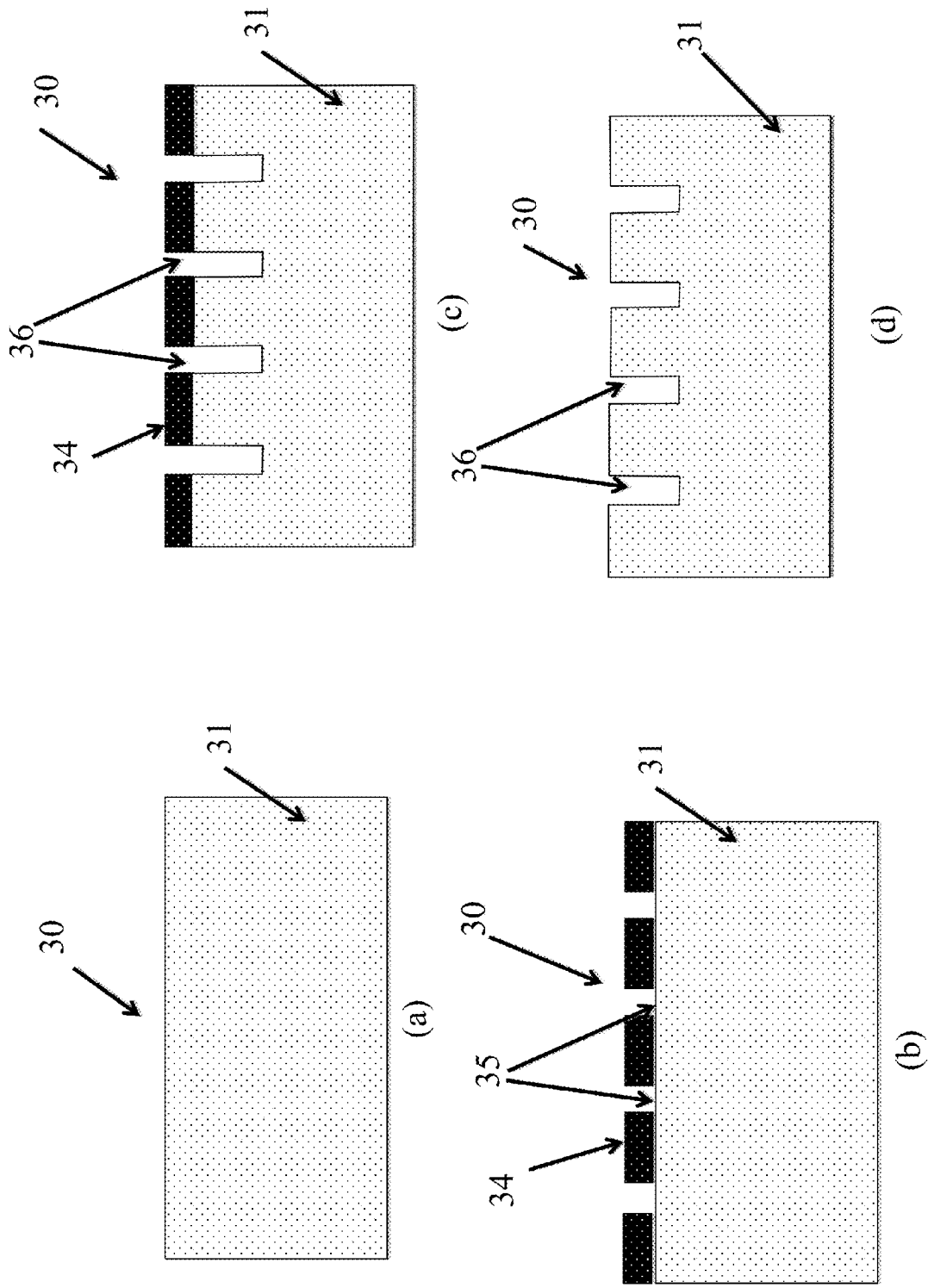
FIGS. 3a-3d are an illustration of a first substrate configuration to etch deep, high-aspect ratio features into a substrate layer of silicon carbide according to the present invention.

In FIG. 3a is shown a cross section of a portion of the substrate of one substrate configuration 30. The substrate configuration 30 has a first material substrate 31 of a predetermined thickness that is composed of Silicon Carbide (SiC). It is noteworthy that the etch technology described in the present invention can be used on any polytype of SiC, including 3C (zinc blende [cubic]), 4H (hexagonal), and 6H (hexagonal).

The first material substrate 31 that is comprised of silicon carbide can have a crystal structure, a partial crystal structure, or be amorphous. Additionally, the first material substrate 31 can include additives or dopants of any type or amount. The thickness of the first material substrate 31 can range from tens of microns to hundreds of microns, or even a few millimeters.

FIG. 3b illustrates a cross section of a portion of the substrate 30 of this substrate configuration with a patterned third material layer 34 with a predetermined thickness on the surface of the first material substrate 31 prior to the etch of the present invention in the first material substrate 31 having been performed. The patterned third material layer 34 functions as an etch mask during the etching of the first material substrate 31. That is, the areas of the surface of the substrate 31 that are covered with the etch mask 34 are not etched because the substrate 31 surface is protected from the plasma etch, whereas the areas not covered on the substrate 31 surface 35, are etched. Etch masking is well known in the art.

FIG. 3c illustrates a cross section of a portion of the substrate 31 of this substrate configuration after an etch of the silicon carbide first material substrate 31 has been performed for a predetermined time and depth. In this illustration, trenches 36 are etched into the first material substrate 31. It is noted that the etch in the first material substrate 31 can be performed through a portion of the first material substrate 31, or completely through the first material substrate 31, depending on the depths desired for any given device design and application. FIG. 3d illustrates a cross section of a portion of the substrate 30 of this substrate configuration after the patterned third material layer 34 that functions as an etch mask has been removed thereby leaving trenches 36 that have been etched into the substrate 31 to a predetermined depth.

Figure 4:
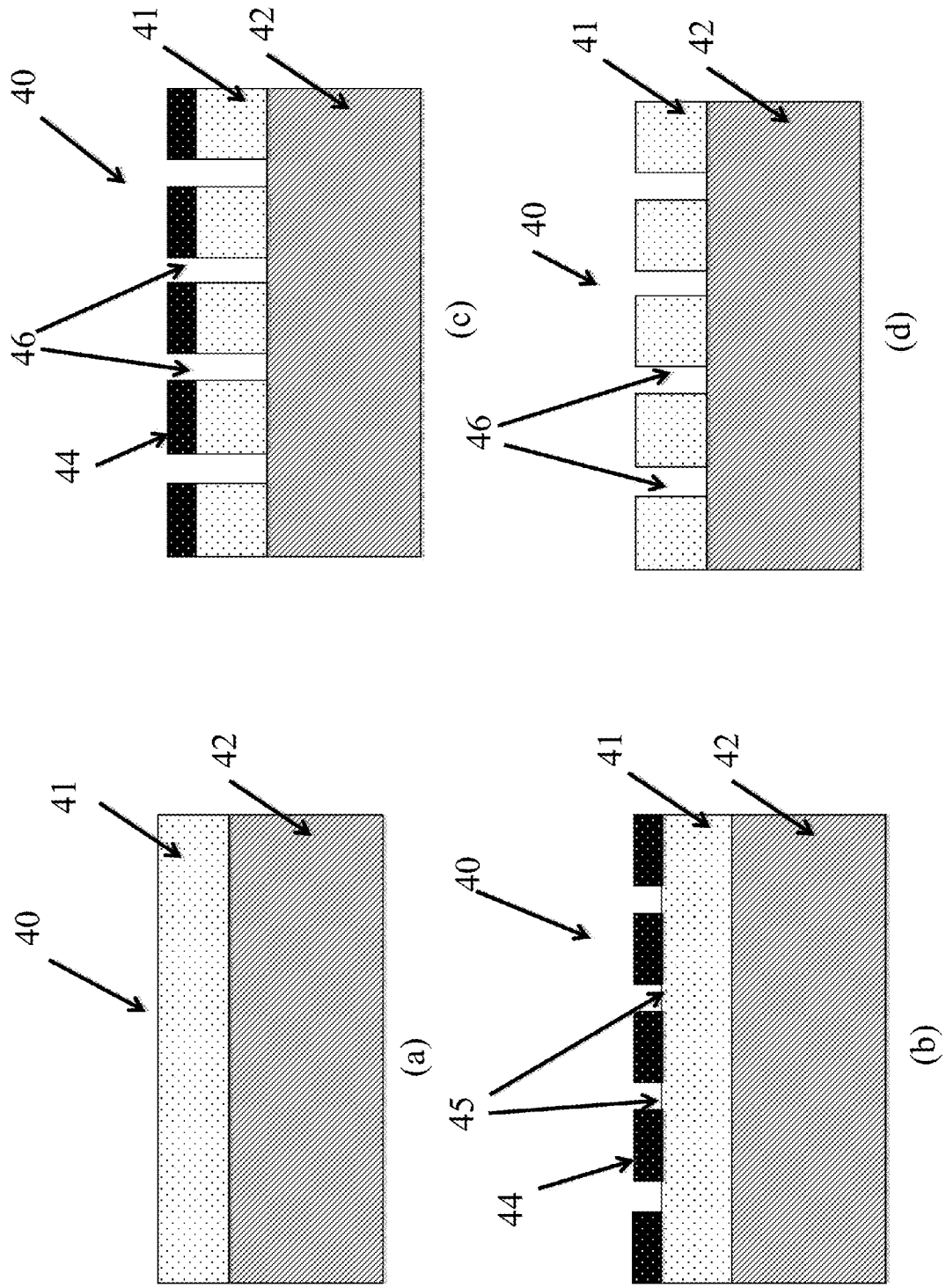
FIGS. 4a-4d are an illustration of a second substrate configuration to etch deep, high-aspect ratio features into a composite substrate according to the present invention.

In FIG. 4a is shown a cross section of a second substrate configuration 40 before performing an etch of the present invention. The substrate configuration 40 has a first material layer 41 of a predetermined thickness that is on top of a second material substrate 42, also having a predetermined thickness. The first material layer 41 is comprised of silicon carbide that can be of any polytype of SiC, including 3C (zinc blende [cubic]), 4H (hexagonal), or 6H (hexagonal).

The first material substrate layer 41 that is comprised of silicon carbide and can have a crystal structure, a partial crystal structure, or be amorphous. Additionally the first material layer 41 can include additives or dopants of any type or amount. The thickness of the first material layer 41 to be etched on the second material substrate 42 can range from below 1 micron to hundreds of microns, or even a few millimeters. The second material substrate 42 can have a thickness ranging from tens of microns to several millimeters.

The second material substrate 42 shown in FIGS. 4a-4d can be a semiconductor, silicon dioxide, ceramic, or a metal.

The semiconductor materials that the second material substrate 42 can be made from include: silicon; germanium; gallium arsenide; gallium nitride; lithium niobate; as well as any known semiconductor material, whether in single crystal or polycrystalline form.

The ceramic materials that the second material substrate 42 can be made from include: aluminum oxide, alumina, titanium nitride, tungsten carbide; chromium carbide; as well as any known ceramic material, whether in single crystal or polycrystalline form.

The silicon dioxide materials that the second material substrate 42 can be made from include: quartz; fused silica; fused quartz; glass; borosilicate glass (Pyrex®); or any material layer that is mostly comprised of silicon dioxide. The second material substrate 42 can have a complete crystal structure, a partial crystal structure, or be amorphous. Additionally the second material substrate 42 can include additives or dopants of any type or amount.

The types of metals that the second material substrate 42 can be made from include: copper; stainless steel; nickel; tungsten; brass; chrome; or titanium, as well as a combination of these materials that have been laminated or alloyed together, whether in single crystal or polycrystalline form.

The first material layer 41 can be deposited onto the second material substrate 42 using a physical vapor deposition (PVD) process or a chemical vapor deposition (CVD) process. Alternatively, the first material layer 41 can also be bonded or affixed onto the second material substrate 42. The first material layer 41 can also be bonded or affixed onto the second material substrate 42 and then be lapped, grinded, and/or polished back to obtain a thinner pre-determined thickness of the first material layer 41. This would be the case when the desired predetermined thickness of the first material layer 41 has a thickness that is thinner than can be easily handled prior to bonding or affixing it to the second material substrate 42.

FIG. 4b illustrates a cross section of a portion of this second substrate configuration 40 with a patterned third material layer 44 with a predetermined thickness on the surface of the first material layer 41 prior to the etch in the first material layer 41 having been performed. The patterned third material layer 44 functions as an etch mask during the etching of the first material layer 41. That is, the areas of the surface of the substrate 41 that are covered with the etch mask 44 are not etched because the substrate first material layer 41 surface is protected from the plasma etch, whereas the areas not covered on the substrate 41 surface that are exposed to the plasma etch 45, are etched. Etch masking is well known in the art.

FIG. 4c illustrates a cross section of a portion of the substrate configuration 40 after the etch of the silicon carbide first material layer 41 has been performed. In this illustration, the trenches 46 are etched completely through the first material layer 41. It is noted that the etch in the first material layer 41 can be performed through a portion of the first material layer 41, or completely through the first material layer 41, as shown in FIG. 4c, depending on the depths desired for any given device design and application. It is also noted in FIG. 4c that the etching mask layer 44 is still present after the etch of the present invention has been performed. FIG. 4d illustrates a cross section of a portion of the substrate configuration 40 after the patterned third material layer 44 that functioned as an etch mask has been removed thereby leaving trenches 46 that have been etched into the first material layer 41 to a predetermined depth.

Figure 5:
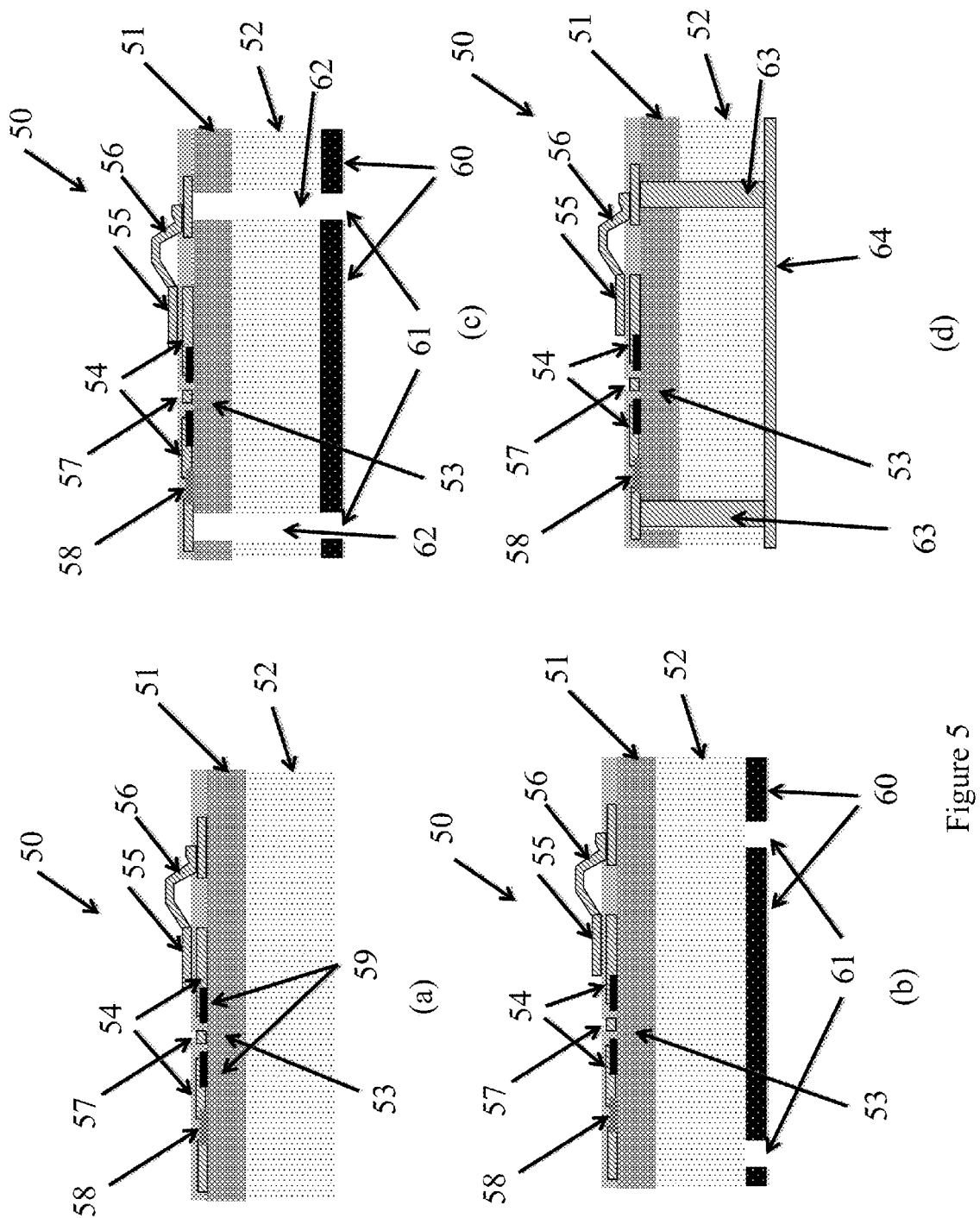
FIGS. 5a-5d are an illustration of a third substrate configuration to etch deep, high-aspect ratio features into a substrate composed of a gallium nitride layer on a silicon carbide substrate according to the present invention.

In FIG. 5a is shown a cross section of a portion of the third substrate configuration 50 before performing the etch of the present invention. The substrate configuration 50 has a second material layer 51 composed of Gallium Nitride (GaN) having a predetermined thickness that is on top of a first material substrate layer 52 composed of Silicon Carbide (SiC) also having a predetermined thickness. The thickness of the second material layer 51 can range from below 1 micron to hundreds of microns. The first material substrate layer 52 can have a thickness ranging from below 10 microns to several millimeters. Additionally, one of more devices and/or systems may have been made either in or on the second material layer 51 prior to performing the etch of the present invention. These devices can be electronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride.

For example, as shown in FIG. 5a one or more transistor devices 53 with a Gold (Au) T-gate 57 and source and drain 59 are electrically interconnected with one or more metal layers 54 on the surface of the second material layer 51. Additionally, one or more passive elements such as resistors 58, Metal-Insulator-Metal (MIM) capacitors 55 and Gold (Au) air-bridges 56 may also be fabricated in or on the second material layer 51. The electrical circuit configuration illustrated in FIG. 5a is what is termed a GaN High-Electron-Mobility Transistor (HEMT) Monolithic Microwave Integrated Circuit (MMIC). It is desirable in this electrical circuit configuration to electrically connect certain circuit elements on the surface of the second material layer 51 to a ground plane 64 that is fabricated on the backside of the first material substrate layer 52 using electrically conductive through-substrate vias (TSVs) 63. These TSVs 63 can be made using the deep, high-aspect ratio etch process of the present invention.

FIG. 5b illustrates a cross section of the third substrate configuration 50 with a patterned third material layer 60 with a predetermined thickness on the back surface of the first material substrate layer 52 prior to the etch in the first material substrate layer 52 and the second material layer 51 has been performed. The patterned third material layer 60 functions as an etch mask during the etching of the first material substrate layer 52 and the second material layer 51. That is, the areas of the surface of the first material substrate layer 52 that are covered with the etch mask 60 are not etched because the first material substrate layer 52 surface is protected from the plasma etch, whereas the areas not covered 61 on the first material substrate layer 52 surface, are etched. Etch masking is well known in the art.

FIG. 5c illustrates a cross section of the third substrate configuration 50 after an etch of the silicon carbide first material substrate layer 52 has been performed for a predetermined time and depth and the etch has continued through the second material layer 51 for a predetermined time and depth. In this illustration, trenches 62 are etched completely through both the first material substrate layer 52 and the second material layer 51. It is noted that the etch in the first material substrate layer 52 can be performed through a portion of the first material substrate 52, or completely through the first material substrate layer 52, depending on the depths desired for any given device design and application. It is also noted that the etch in the second material layer 51 can be performed through a portion of the second material layer 51, or completely through the second material substrate layer 51, depending on the depths desired for any given device design and application. Obviously, for any of the second material layer to be etched, then the etch through the first material substrate layer 52 would have to be completely through the entirety of the first material substrate layer 52 thickness. It is noted in FIG. 5c that the etching mask layer 60 is still present after the etch of the present invention has been performed. It is also noted that the etch method of the present invention can be used not only to etch deep, high-aspect ratio features into SiC material, but also can be used to etch deep, high-aspect ratio features into GaN material as well as shown in FIG. 5c.

FIG. 5d illustrates a cross section of the third substrate configuration 50 after the patterned third material layer 60 that functions as an etch mask has been removed thereby leaving trenches 62 that have been etched through both the second substrate material layer 52 and the first material substrate layer 51 to a predetermined depth. As shown in FIG. 5d, the third material layer 60 that acts as an etch mask shown in FIG. 5c has been removed, and the etched trenches 62 shown in FIG. 5c have been filled with a conductive fourth material to form electrically conductive filled vias 63 through the thickness of the second material substrate layer 52 and the first material layer 51. These electrically-conductive vias 63 electrically connect to one or more metal layers 54 that electrically connect to one or more devices 53, 55, 56, and/or 58 on the surface of the second material layer 51. Additionally, a fourth material layer 64 that electrically connects to the filled vias 63 and acts as a ground plane is deposited on the back surface of the second material substrate layer 52. The backside ground plane 62 electrically connects to the one or more metal layers 54 at selected locations on the frontside of the first material layer 51.

The third substrate configuration 50 shown in FIGS. 5a-5d illustrating the use of the etch method of the present invention in the fabrication of electrically conductive through-substrate vias for GaN HEMT devices is only one example of the use of the etch method of the present invention and it is understood that the present invention can be used whenever deep, high-aspect features are useful in SiC and/or GaN material layers. It is also noted that the devices 53, 55, 56, and 58 used as device examples in FIGS. 5a-5d are only some of the possible devices that can be present and can benefit from the present invention. Specifically, one or more devices and/or systems from electronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide and/or gallium nitride may be present and benefit from the use of the present invention.

In FIGS. 6a-6d is shown a cross section of a portion of the fourth substrate configuration 70 before performing the etch of the present invention. The fourth substrate configuration 70 has a first material substrate layer 71 composed of Silicon Carbide (SiC) having a predetermined thickness. The thickness of the first material substrate layer 71 can range in thickness from below 10 microns to several millimeters. Additionally, one of more devices and/or systems may have been made either in or on the second material substrate layer 71 prior to performing the etch of the present invention. These devices can be electronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide.

Figure 6:
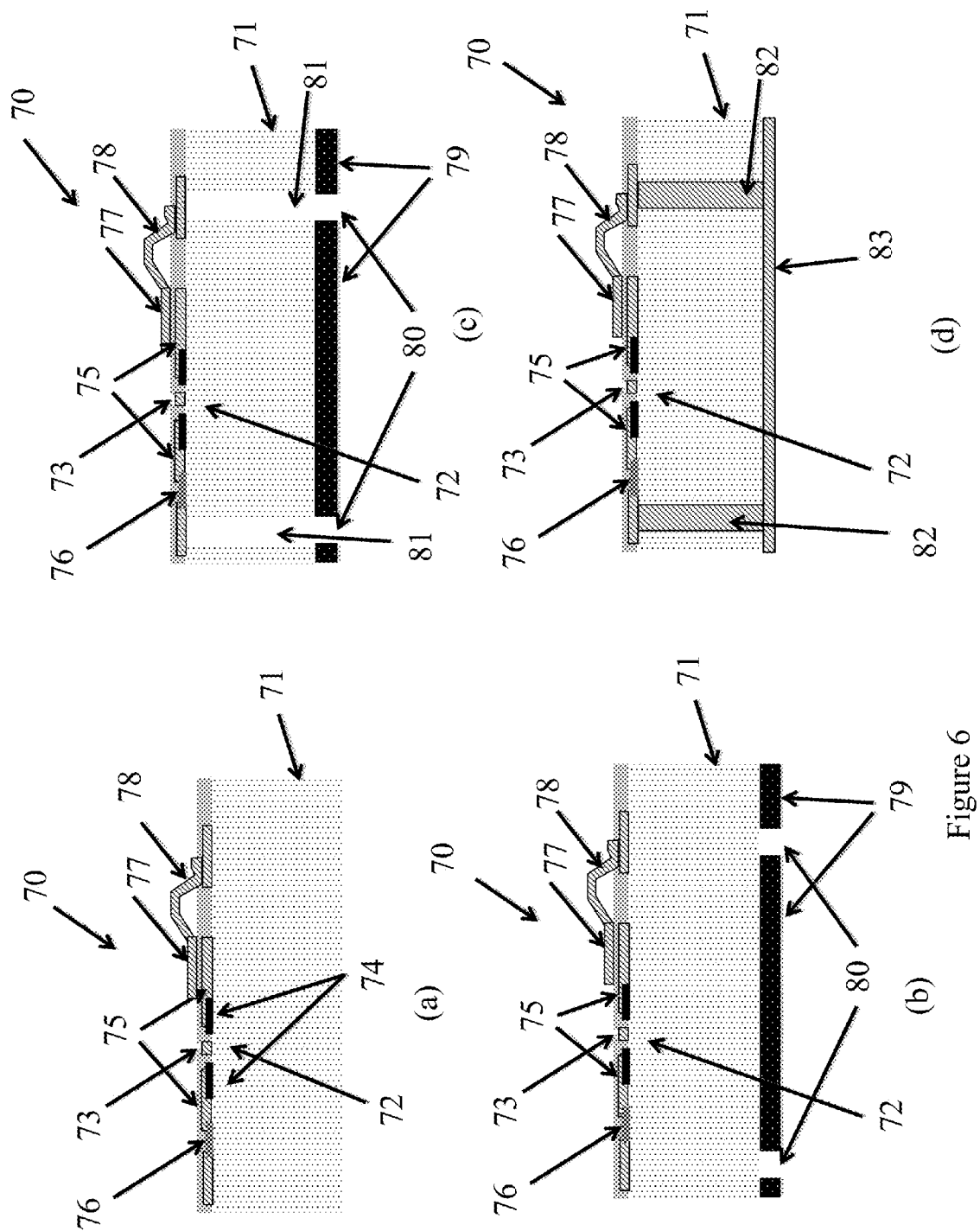
FIGS. 6a-6d are an illustration of a fourth substrate configuration to etch deep, high-aspect ratio features into a substrate composed of silicon carbide according to the present invention.

For example, as shown in FIG. 6a one or more transistor devices 72 with gate electrodes (or base electrodes if a bipolar transistor) 73 and source and drain (or an emitter and collector if a bipolar transistor) 74 are electrically interconnected with one or more metal layers 75 on the surface of the first material substrate layer 71. Additionally, one or more passive elements such as resistors 76, capacitors 77 and micromechanical devices 78 may also be fabricated in or on the first material substrate layer 71. In some applications, it may be desirable to electrically connect specific devices on the surface of the first material substrate layer 71 to a ground plane 83 that is fabricated on the backside of the first material substrate layer 71 using electrically conductive through-substrate vias (TSVs) 82. These TSVs 82 can be made using the deep, high-aspect ratio etch process of the present invention.

FIG. 6b illustrates a cross section of the fourth substrate configuration 70 with a patterned third material layer 79 with a predetermined thickness on the back surface of the first material substrate layer 71 prior to the etch in the first material substrate layer 71 has been performed. The patterned third material layer 79 functions as an etch mask during the etching of the first material substrate layer 71. That is, the areas of the surface of the first material substrate layer 71 that are covered with the etch mask 79 are not etched because the first material substrate layer 71 surface is protected from the plasma etch, whereas the areas not covered 80 on the first material substrate layer 71 surface are etched. Etch masking is well known in the art.

FIG. 6c illustrates a cross section of the fourth substrate configuration 70 after an etch of the silicon carbide first material substrate layer 71 has been performed for a predetermined time and depth. In this illustration, trenches 81 are etched completely through the first material substrate layer 71. It is noted that the etch in the first material substrate layer 71 can be performed through a portion of the first material substrate 71, or completely through the first material substrate layer 71, depending on the depths desired for any given device design and application. It is noted in FIG. 6c that the etching mask layer 79 is still present after the etch of the present invention has been performed.

FIG. 6d illustrates a cross section of the fourth substrate configuration 70 after the patterned third material layer 79 that functions as an etch mask has been removed thereby leaving trenches 81 that have been etched through the first material substrate layer 71 to a predetermined depth. As shown in FIG. 6d, the third material layer 79 that acts as an etch mask shown in FIG. 6c has been removed, and the etched trenches 81 shown in FIG. 6c have been filled with a conductive fourth material to form electrically conductive filled vias 82 through the thickness of the first material substrate layer 71. These electrically-conductive vias 82 electrically connect to one or more metal layers 75 that electrically connect to one or more devices 72, 76, 77, and/or 78 on the surface of the second material layer 71. Additionally, a fourth material layer 83 that electrically connects to the filled vias 82 and acts as a ground plane 83 is deposited on the back surface of the first material substrate layer 71. The backside ground plane 83 electrically connects to the one or more metal layers 75 at selected locations on the front-side of the first material substrate layer 71.

The fourth substrate configuration 70 in FIGS. 6a-6d illustrating the use of the etch method of the present invention in the fabrication of electrically conductive through-substrate vias for SiC devices is only one example of the use of the etch method of the present invention and it is understood that the present invention can be used whenever deep, high-aspect features are useful in SiC material layers. It is also noted that the devices 73, 76, 77, and 78 used as device examples in FIGS. 6a-6d are only some of the possible devices that can be present and can benefit from the present invention. Specifically, one or more devices and/or systems from electronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide may be present and benefit from the use of the present invention.

There are several methods that can be used for making the etch mask 34 in FIGS. 3a-3d, 44 in FIGS. 4a-4d, 60 in FIGS. 5a-5d, and 79 in FIGS. 6a-6d on the surface of the silicon carbide layer prior to the etch being performed in the silicon carbide material. It is important to note that the process to make the etch mask can be performed on any of the substrate configurations comprised of one or more material layers as described in FIGS. 3a-3d, 4a-4d, 5a-5d, and 6a-6d, respectively.

Figure 7:
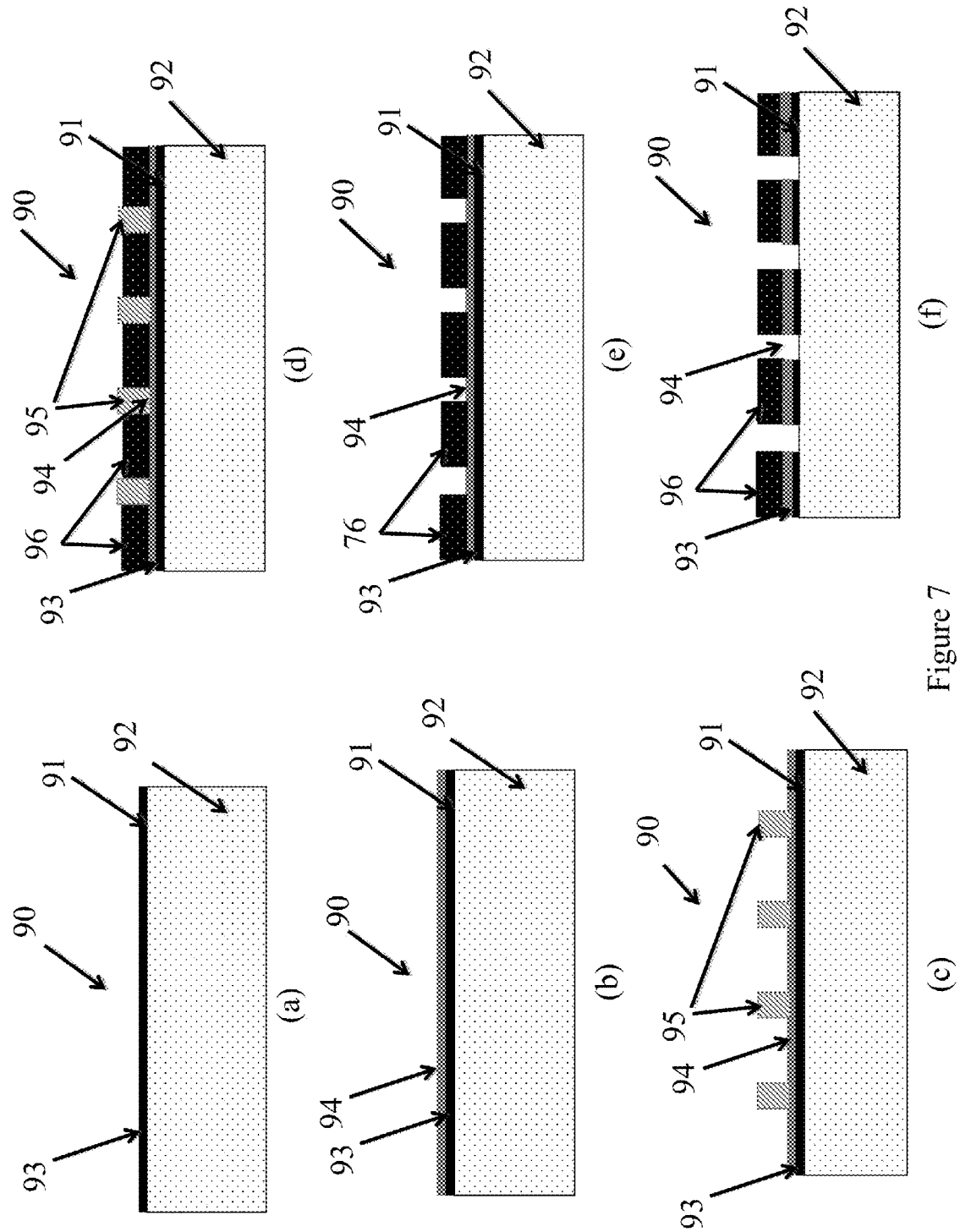
FIGS. 7a-7f are an illustration of making an etch mask on the substrate according to the present invention.

In one method of making an etch mask as shown on the substrate configuration 90 shown in FIGS. 7a-7f, the surface 91 of the silicon carbide substrate or material layer 92 has a thin adhesion layer 93 deposited on the surface 91 of the substrate 92 as shown in FIG. 7a. This adhesion layer 93 is usually required to get good adhesion between the subsequently deposited plating base layer and the substrate material layer 92, which is composed of silicon carbide. This adhesion layer 93 is usually comprised of titanium or chrome, but other metals can be used as well, and the thickness of the adhesion layer 93 is typically between 50 Angstroms to 500 Angstroms. This adhesion layer 93 can be deposited using any technique of physical vapor deposition, including sputtering and evaporation.

Subsequently, a plating base material 94 layer is deposited directly on the surface of the adhesion layer 93 as shown in FIG. 7b. The plating base 94 is usually made of gold, but other electrically conductive materials can be used as well such as silver or copper. The thickness of this plating layer 94 can range from below 50 nm to over 1.0 micron. This plating base layer 94 can be deposited using any technique of physical vapor deposition including sputtering and evaporation and may be deposited in the same system as the adhesion layer 93 was deposited without breaking vacuum. Subsequently, a suitable polymer material layer 95 is deposited onto the surface plating base layer 94 of the substrate 92, which is then patterned into the desired dimensions and features of a plating mold 95 as shown in FIG. 7c. The polymer layer 95 will typically be a photoresist or photosensitive polyimide material that can be directly patterned using photolithography. After a short exposure to an oxygen plasma to remove any organic contaminates on the surface of the plating base 94, the substrate is immersed into an electrochemical plating bath solution to electroplate a predetermined material layer 96 onto the plating base 94 where it is exposed in the polymer mold 94 as shown in FIG. 7d. The plating process is continued until a desired thickness of material 96 has been plated and the ultimate thickness will depend on the material being used as an etch mask 96.

Subsequently, the substrate 92 is removed from the plating bath and it may be desirable to have the surface of the plated metal layer 96 polished to reduce the surface roughness. The polymer plating mold 95 is then removed as shown in FIG. 7e by immersing the substrate 92 into an appropriate chemical solution that selectively removes the polymer mold 95. The plating base 94 and adhesion layer 93, if an adhesion layer is present, are then removed in the locations where the plating base layer 94 is exposed, that is, in those locations on the substrate surface 91 where there is not any plated material layer 96 on top of the plating base layer 94 as shown in FIG. 7f. The technique for removing the plating base 94 and adhesion layer 93, if present, is by immersing the substrate into an appropriate chemical solution(s). Such chemical solution(s) are well known to those skilled in the art. Alternatively, ion milling can also be used to remove the plating base layer 94 and, if present, the adhesion layer 93.

Figure 8:
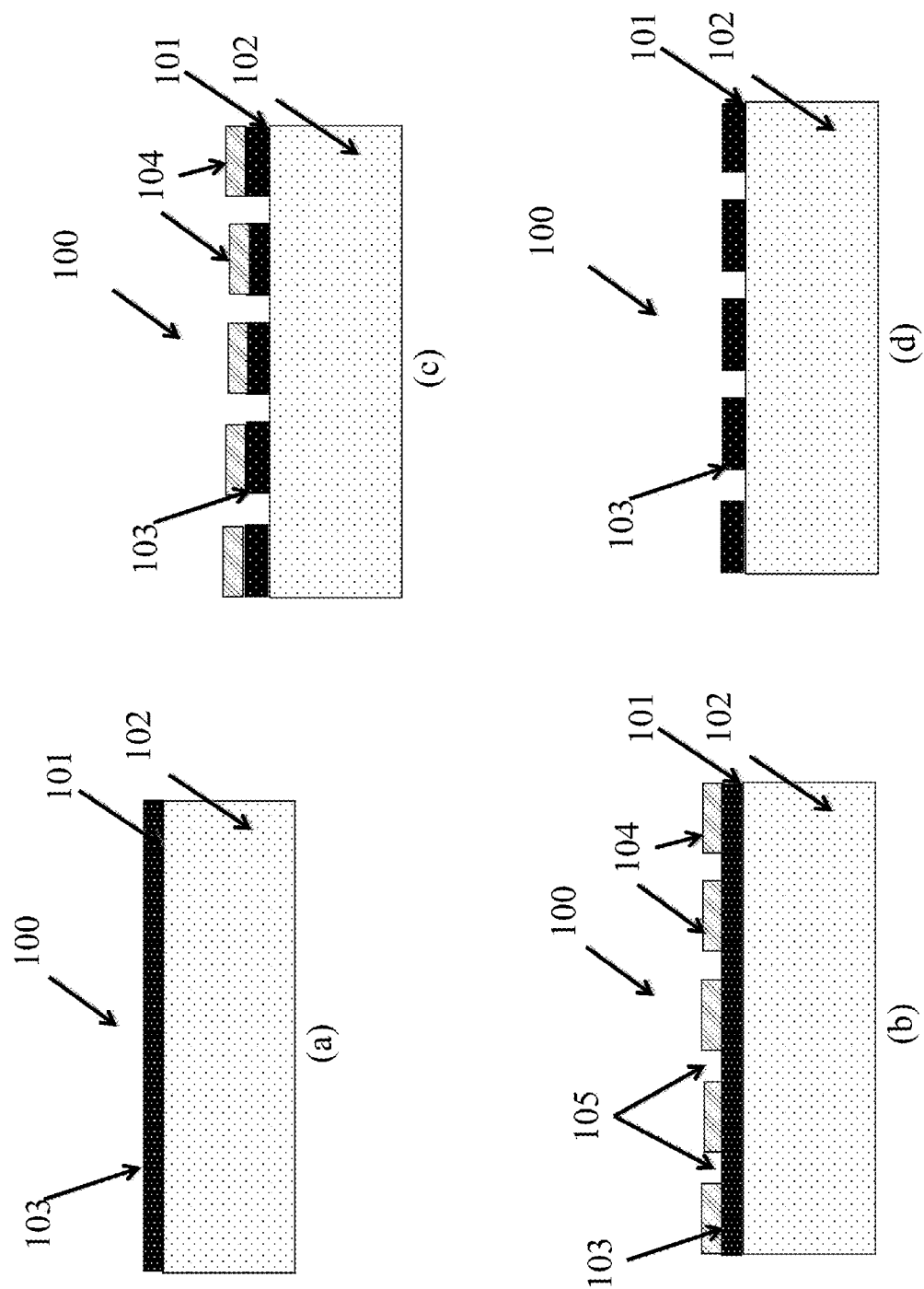
FIGS. 8a-8d are an illustration of making an etch mask on the substrate according to the present invention.

An alternative method 100 shown in FIG. 8a-8d for making an etch mask 103 on the surface 101 of the substrate 102 involves depositing an etch mask material layer 103 onto the surface 101 of the substrate 102 as shown in FIG. 8a. Although not shown in FIG. 8a, an adhesion layer may also be deposited onto the surface 101 of the substrate 102 prior to the deposition of the etch mask layer 103. Subsequently, a layer of photoresist 104 is deposited onto the surface 101 of the deposited layer etch mask material layer 103 and patterned using photolithography as shown in FIG. 8b thereby opening areas in the photoresist 105 to expose selected areas of the etch mask material layer 103. Subsequently, the etch mask layer 103 is etched where the photoresist 104 is not present to protect the etch mask material layer 103 in the open areas 105 as shown in FIG. 8c. The etch method used on the etch mask 103 depends on the etch mask material, but includes wet chemical etching, reactive ion etching, plasma etching, ion milling, etc. Finally, the photoresist layer 104 is removed thereby completing the patterning of the etch mask 103 as shown in FIG. 8d.

Alternatively, the etch mask can be made on the substrate using lift-off patterning technology. Using liftoff, a photosensitive polymer is deposited onto the substrate surface followed by exposure of the polymer layer to pattern the polymer layer in a developer solution thereby opening up areas on the substrate where the etch mask is desired. Next, the etch mask material layer is deposited on the substrate. Note that an adhesion layer may be used if desired. After deposition of the etch mask layer, the substrate is placed in a solvent solution to remove the polymer layer thereby leaving behind the etch mask layer in the desired areas on the substrate.

Electroplated etch masks, directly patterned etch masks, and liftoff etch masks are all well known in the art.

Importantly, the technique used to fabricate the hard mask will depend on the hard mask material selected and the thickness of the etch mask required, which in turn depends on the depth of the etch and the etch mask selectivity. The etch mask selectivity is the ratio of the etch rate of the material being etched and the etch rate of the mask material, or in equation form:

Etch mask selectivity=(the etch rate of the material being etched)/(etch rate of the etch mask).

It is also important to point out that the etch mask will have a pattern that is the reverse of the to-be etched features in the silicon carbide layer or substrate or the gallium nitride on silicon carbide layer or substrate.

Among the etch mask materials that are suitable using the method of the present invention are included various metals: nickel; silicon; titanium; tungsten; chrome; copper; brass; gold; silver; as well as a number of semiconductors: silicon, germanium, silicon carbide; and ceramic material layers including: alumina; tungsten carbide; chromium carbide; and others.

Copper has been found to be particularly attractive as an etch mask in the present invention, since it exhibits very high etch mask selectivity in this etch processes. As defined above, mask selectivity is defined as the ratio of the etch rate of the material being etched to the etch rate of the etch mask. A high mask selectivity ratio is desirable in the etching of materials since it allows a thinner layer of etch mask material to be required which simplifies the fabrication of the etch mask and also enables improved dimensional control of the features being made by the etching process. A mask selectivity above 50 is considered a high mask selectivity and a very high mask selectivity is a ratio above 100. The reason this is important is that a thinner layer of copper can be used to etch deep into silicon carbide (and gallium nitride, if present) and a thinner layer of etch mask affords the capability for more precise dimensional control of the etch mask features as well as the etched features, which is a high-fidelity reverse representation of the etch mask. "High-fidelity" means a reproduction that is faithful to the original. Specifically, a copper etch mask can have a thickness of less than one micron and still allow deep etches (>100 microns) into the silicon carbide material being etched. Additionally, it should be noted that one or more etch mask materials layers may be used as well.

The etching process method of the present invention involves the optimal or near optimal adjustment of the independent process parameters that substantially affect the outcome of the etch process. The most important characteristics related to the most desired outcome of an etch of silicon carbide are the depth of the etch, the aspect ratio, the verticality of the etched feature sidewalls, hard mask selectivity to etch mask used, and the cleanliness and defect level of the etched pattern. It is desired that the etch achieve deeper etches into silicon carbide, since this will provide increased flexibility for use of this etch process for different device designs compared to only being able to etch shallow features. It is also desired to have an etch process that has a high aspect ratio since this increases device density and improved process flexibility for use for different device designs compared to an etch process having more sloping sidewalls. Generally, for most device fabrications, a vertical sidewall, in which the sidewall is 90-degrees orthogonal or nearly 90-degrees orthogonal to the top surface being etched is most desired. It is also most desired that the mask selectivity is as high as possible, since this allows the use of thinner etch masks. Lastly, it is most desired to have few to no etch defects. The usual type of etch defect in this type of process is generally caused by micro-masking, in which a particulate that may be a result of the etching process lands on the surface of the material being etched and either terminates or slows down the etch process at that location, while the areas around this location continue to etch at the normal rate. This leads to point defects that protrude from the bottom of the etch trench upwards some distance toward the surface of the etched substrate.

It is noteworthy that the depth of the etch and aspect ratio will depend on the device design that is being fabricated. Therefore, there are tradeoffs with the etch process parameter settings in the desired outcomes. For example, a higher aspect ratio can be obtained with a shallower depth of etched features.

The technique used to determine the optimal or near optimal process parameter settings is based on a Design of Experiments (DOE). In a DOE, selected process settings are varied in a pre-selected fashion and important characteristics of the resulting etched structure are measured for each set of process settings attempted. Each substrate etched with a specific set of process parameters settings represents a unique data point. Each substrate has extensive metrology performed on it after the etch to determine and quantify the outcome of each etch based on the specific etch process parameters and desired etch outcomes. The metrology performed in the DOE is described in more detail below.

A listing of all etch process parameters 110 known to affect the etch outcome is shown in the table in FIG. 9. As can be seen, there are a total of fourteen (14) etch parameters.

The etching of silicon carbide of the present invention uses Sulfur Hexafluoride ($SF_6$) as a reactive gas for the plasma. The dissolution of the silicon carbide occurs as a complex interaction between ions in the plasma and the solid silicon carbide. Due to the directionality of the incoming ions, there is a preferential removal direction of the material being etched, which leads to anisotropy in the etched feature shapes.

It has been established that the addition of oxygen gas to the plasma affects the etch process. Therefore, changes in etch rate, mask selectivity, and anisotropy (verticality and shape of the sidewalls) can be realized by varying the flow rate of Oxygen (O2) into the etch chamber The metrology data collection 120 performed on the substrates during the performance of the DOE was based on a number of tools and techniques including: optical microscopy, scanning electron microscopy (SEM), and optical profilometry. Using these methods, a total of eighteen characteristic parameters 120 (see FIG. 10) were derived for each substrate. The procedure to process and collect the metrology data 120 from the DOE substrates was as follows:

1. Fabricate substrates of silicon carbide having suitable patterned hard etch mask on the substrate surfaces;
2. Perform pre-etch inspection/data collection on the substrates;
3. Etch substrates using a predetermined etch process parameter setting selected as part of the DOE;
4. Collect post-etch metrology data on each substrate;
5. Clean substrate; and then,
6. Collect cross-section metrology data on substrates.

Figure 11:
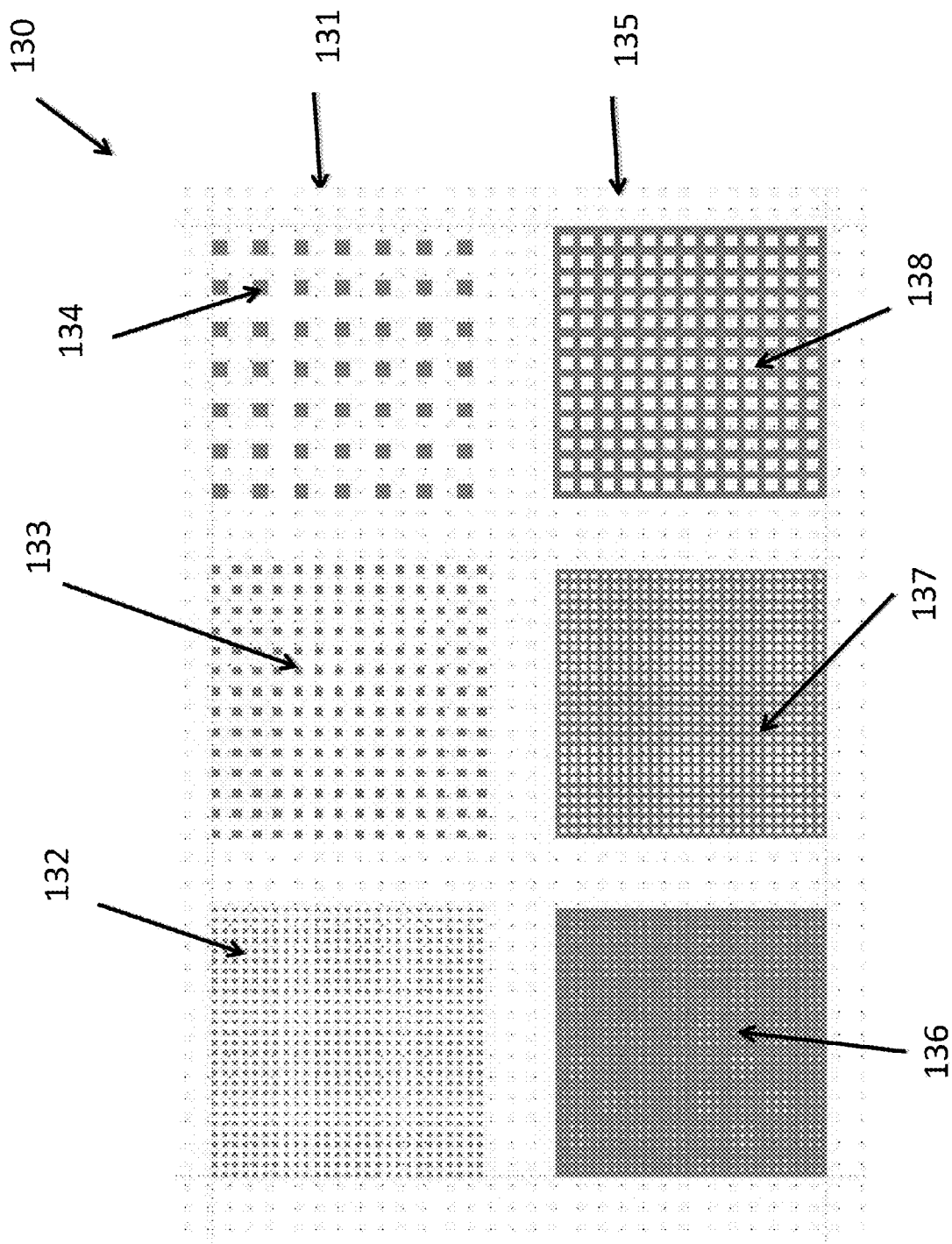
FIG. 11 is an illustration of the portion of the etch mask used in the design-of-experiments (DOE) described herein.

For common reference, a mask layout was designed having a number of different sized features that is used to fabricate the etch mask on the silicon carbide material. A cell 130 from the etch mask layout used for the DOE is shown in FIG. 11 and the top row 131 includes 25 um 132, 50 um 133 and 100 um 134 via arrays. The bottom row 135 is corresponding post arrays having dimensions of 25 um 136, 50 um 137 and 100 um 138. The dark areas are etched and this cell 130 shown in FIG. 11 is stepped out multiple times across the silicon carbide surface.

In performance of the DOE, each of the individual process parameters are varied one at a time and the process outcomes are measured by taking metrology measurements on the substrates both before and after etching. Once all data of the DOE has been collected, multiple regression analysis is used to analyze and map the data in order to determine the weighted optimal etch process parameter settings by interpolation of the derived regression model.

The definition of an optimal or near optimal etch process depends on the exact specifics of what is desired in the outcome of an etch process. Therefore, there are variations on the recipe (method) for various process outcomes. In any case, the etch processes given below can be used to etch into silicon carbide materials to depths of less than 1 micron to several millimeters and with aspect ratios ranging from less than "1 to 1", from an aspect ratio of between "1 to 1" to "10 to 1", and even aspect ratios to well over "10 to 1". It should be noted that the hard mask will need to be adjusted to be sufficiently thick so that it will be able to remain until the etch depth desired is obtained.

The preferred embodiment method for the etching of deep, high aspect ratio features using an Inductively-Coupled Plasma (ICP) etch system into silicon carbide (and gallium nitride on silicon carbide) is comprised of a Radio Frequency (RF) bias power on the substrate being etched of between 50 and 200 Watts, a substrate chuck temperature of between −5 and 20 degrees Celsius, an Oxygen (O2) gas flow rate of between 0 and 20 standard cubic centimeters per minute (sccm), an etch chamber gas pressure of between 1 and 15 milliTorr, a Sulfur Hexafluoride ($SF_6$) gas flow rate of between 50 and 150 standard cubic centimeters per minute (sccm), and a Radio Frequency (RF) antenna power to create the plasma inside the etch chamber of between 1500 and 2500 Watts.

Additionally, if the etcher employs a heat shield and a temperature controlled chuck, then the preferred embodiment uses a heat shield temperature of between 100 and 200 degrees-Celsius and a Helium gas substrate cooling pressure of between 2 and 20 Pascals.

Additionally, if the etch is performed on an ICP etch tool that employs an electromagnetic neutral loop comprised of magnetic coils 28 (FIG. 2), which enables spatial redistribution of ions 22 in the plasma 20 to enhance etching uniformity across the substrate 12 as shown in FIG. 2, then the preferred embodiment uses a top magnet current of between 4 and 8 Amps, a center magnet current of 8 and 12 Amps, and a bottom magnet current of between 4 and 8 Amps.

Typically, depending on the depth of the etch and the time spent etching, a cleaning cycle may be performed between etch cycles. During the cleaning cycle, the flow rate of etch gas, specifically Sulfur Hexafluoride ($SF_6$) is reduced to 0 standard cubic centimeters per minute (sccm), and the flow rate of Oxygen (O2) gas is continued into the etch chamber with a plasma in order to perform a cleaning of the etch chamber. Although any etch cycle time and cleaning time can be used effectively for the etch method of the present invention, an etch cycle time of between 10 and 120 minutes, and an Oxygen (O2) clean cycle time of between 30 seconds and 10 minutes that is performed in between each etch cycle, would be one example of suitable times.

Argon gas may be introduced into the process chamber during etching to modify the etch rate, mask selectivity, and anisotropy of the etched features in the silicon carbide, and gallium nitride if present. The amount of Argon gas introduced will be between 0 and 50 standard cubic centimeters per minute (sccm).

It is important to note that there is a range of values for each process parameter. There are several reasons for this. First, each etch tool will have slightly different values of each process parameter in order to have optimal etch results based on slight differences in the tool design and performance. Second, the thermal characteristics, specifically the thermal resistance from the surface of the substrate to the backside of the substrate where the active Helium cooling is used to control the temperature of the substrate, will vary from substrate to substrate, depending on the exact thickness of the substrate and layers on the substrate, and this has a slight impact on the etch outcome. Therefore, the etch recipe will be slightly adjusted to compensate for differences in the substrate configuration and thickness of the material layers.

The above process method is suitable for etching deep, high aspect ratio features into silicon carbide (and gallium nitride on silicon carbide). However, a more preferred embodiment of the method for the deep, high-aspect ratio etching of silicon carbide (or gallium nitride on silicon carbide) is as follows:

RF Bias Power: 90 to 110 Watts
Substrate temperature: 0 to 14 C
O2 gas flow: 8 to 12 sccm
Chamber pressure: 4 to 6 milliTorr
SF6 gas flow: 80 to 120 sccm
RF antenna power: 1900 to 2100 Watts Additionally, if the etch is performed on an ICP etch tool that employs a heat shield and a temperature controlled chuck, then the more preferred embodiment uses:

Heat shield temperature: 140 to 160 C
He cooling pressure: 3 to 7 Pascals

Additionally, if the etch is performed on an ICP etch tool that employs an electromagnetic neutral loop comprised of magnetic coils 28, which enables spatial redistribution of ions 22 in the plasma 20 to enhance etching uniformity across the substrate as shown in FIG. 2, then the more preferred embodiment uses:

Top magnet current: 5.9 to 6.3 Amps
Center magnet current: 10.0 to 10.2 Amps
Bottom magnet current: 5.9 to 6.3 Amps Although any etch cycle time and cleaning time can be used effectively for the etch method of the present invention, an etch cycle time of between 20 and 40 minutes, and an Oxygen (O2) clean cycle time of between 30 seconds and 5 minutes that is performed in between each etch cycle, would be one example of suitable times.

Using the above process parameter settings will result in an average etch rate of approximately 1 micron per minute, approximately an 88 to 92-degree nearly vertical sidewall, an approximately 130 to 1 mask selectivity with a copper etch mask, an approximate aspect ratio of 12 to 1, an approximate etch depth uniformity across the substrate of +/−1.5% of the etch depth, no defects in the etched features, and an etch depth of over 150 microns.

Argon gas may be introduced into the process chamber during etching to modify the etch rate, mask selectivity, and anisotropy of the etched features in the silicon carbide, and gallium nitride if present. The amount of Argon gas introduced will be between 0 and 50 standard cubic centimeters per minute (sccm).

The process of etching of the present invention can be used to etch features partly into the silicon carbide material layer or substrate, as well as completely through the silicon carbide material layer or substrate, depending on the etch depth desired and the device or structure design. The process of etching of the present invention can also be used to etch deep, high-aspect ratio features into any of the four substrate configurations shown in FIGS. 3a-3d, 4a-4d, 5a-5d and 6a-6d. Moreover, the process of etching of the present invention can be used to etch deep, high-aspect ratio features into gallium nitride layers on silicon carbide substrates.

It is noted that the above etch results are dependent on the exact features and dimensions, the amount of area of the substrate surface being etched, the thickness and type of etch mask, and the depth of the etch, and therefore these results may vary depending on the exact details of the etch and substrate being employed. Therefore, it should also be noted that the recipes include process parameters that are given as a range of values. One reason for this is that there will be slight differences in tool settings from tool to tool. Secondly, there may be slight differences based on the exact substrate configuration used, including the exact type of materials used in the substrate layers and the thickness that will impact the exact process settings in order to obtain the optimal or near optimal outcome.

Additionally, depending the exact situation there may be additional requirements that must be met in order to obtain an optimal or near optimal result with the etch process of silicon carbide of the present invention. First, depending on the depth of the etch and the type of etch mask used, it may be desirable to use the minimal amount of etch mask material across the substrate surface, particularly if the etch mask is made from nickel. The reason is that if larger areas of the surface are covered by the etch mask, it increases the risk of particulates which can result in etch defects in the etched areas of the substrate.

Figure 12:
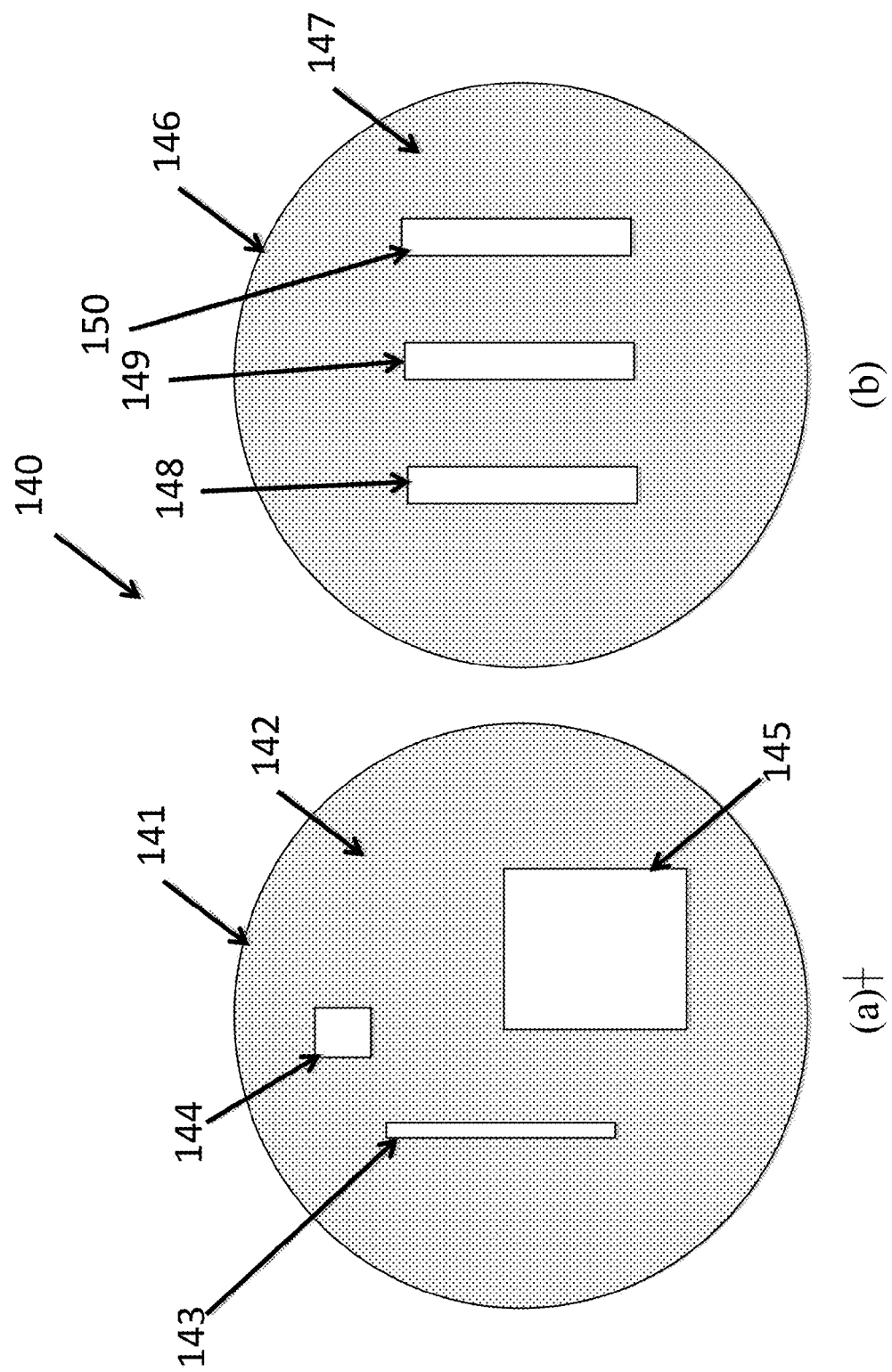
FIGS. 12a and 12b are an illustration of two substrates with feature width to be etched that are as in FIG. 12(a) dissimilar, or as in FIG. 12(b) similar, as described herein.

Second, if uniform trench etch depths are desired, then the open area features in the etch mask should have the same nominal dimensions across the wafer. This is illustrated in FIG. 12, in which two substrates having different dimensions 140 in the etch mask are shown in FIGS. 12a and b.

In FIG. 12a, which is a plane view of a substrate 141, an etch mask 142 covers most of the substrate 141, except for the open area features in the etch mask given by the rectangles 143, 144 and 145, where the silicon carbide would be exposed and can be etched using the present invention. The etch rate depends on the size of the exposed areas on the substrate. That is, if the mask width is larger, the etch rate will be higher and conversely, if the masking width is smaller, the etch rate will be lower. Consequently, if there are features having different sized widths, the etch rate will vary, and by consequence, so will the depths of the etch features. Therefore, using the etch of the present invention, in performing an etch of the present invention on substrate 141, feature 145 would have the highest etch rate and for a given etch time, would have the deepest trench, whereas feature 144 would have a less deep etch for the same etch time, and feature 143 would have the shallowest etch for the same etch time. In comparison, substrate 146 with an etch mask 147 has three features, given by 148, 149 and 150 all having the same feature widths. For a given etch time, the features 148, 149 and 150 will all have approximately the same depth of the trenches. Therefore, in order to have uniform trench depths, the widths of the features should be approximately equal across a substrate such as shown on substrate 146 in FIG. 12b.

Third, the etch chamber should be cleaned on a periodic basis between etches. For long etches, the chamber may need to be cleaned after each sample has been etched. This will reduce the amount of particulates in the etch chamber, and thereby, reduce the probability of etch defects. After an etch has been completed, the etch chamber walls are coated with a complex material compound as a by-product of the etch process that can flake off from the chamber walls and land onto the substrate surface. The cleaning process involves a combination of oxygen plasma cleans and mechanical scrubbing of the chamber liner walls with an abrasive pad. Wiping the walls of the etch chamber with a solvent may also be advised in the cleaning procedure. A suitable solvent for the wiping of the chamber walls is isopropylalcohol.

Figure 13:
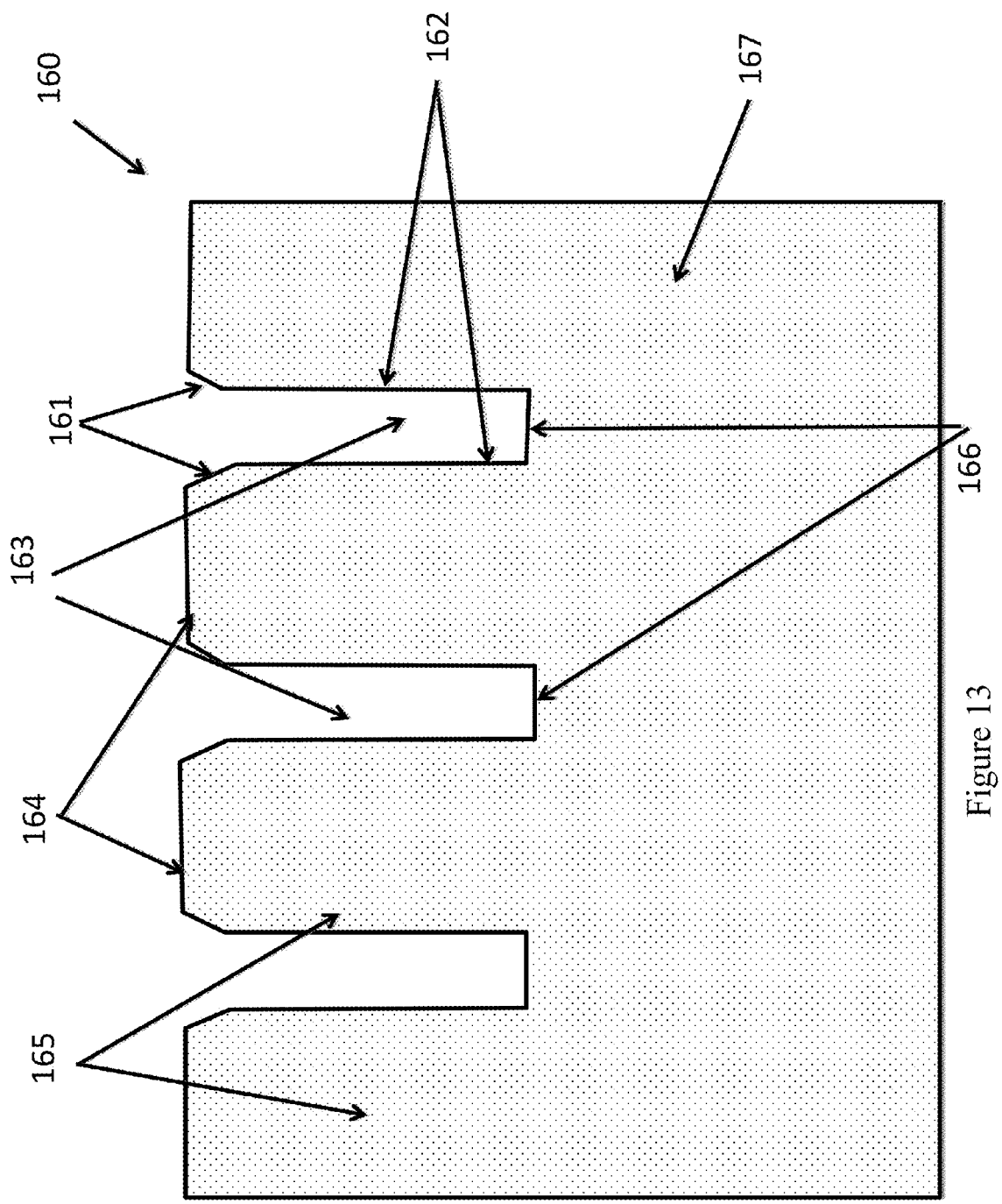
FIG. 13 is an illustration of the facets of the un-etched features as described herein.

Fourth, for a given mask material and selectivity as well as depth of etched features, the hard mask may need to be sufficiently thick so as to reduce or eliminate faceting of the sidewalls of the etched silicon carbide material. FIG. 13 is an illustration of a cross section of a portion of a series of trenches 163 etched in silicon carbide material layer or substrate 167 showing an example of faceting 161 at the top of the sidewalls 162 of the etched trenches 163 into a silicon carbide material layer or substrate 167. The un-etched portion of the silicon carbide 165 on either side of the trenches 163 have tops 164 which is the surface of the silicon carbide substrate where the etch mask was located, but has been removed in this illustration. As can be seen in the top portion of the sidewalls 162, there is a sloping sidewall 161 that has a less steep angle than the vertical or nearly vertical sidewalls 162 of the trenches 163 and this is termed "faceting."

Figure 14:
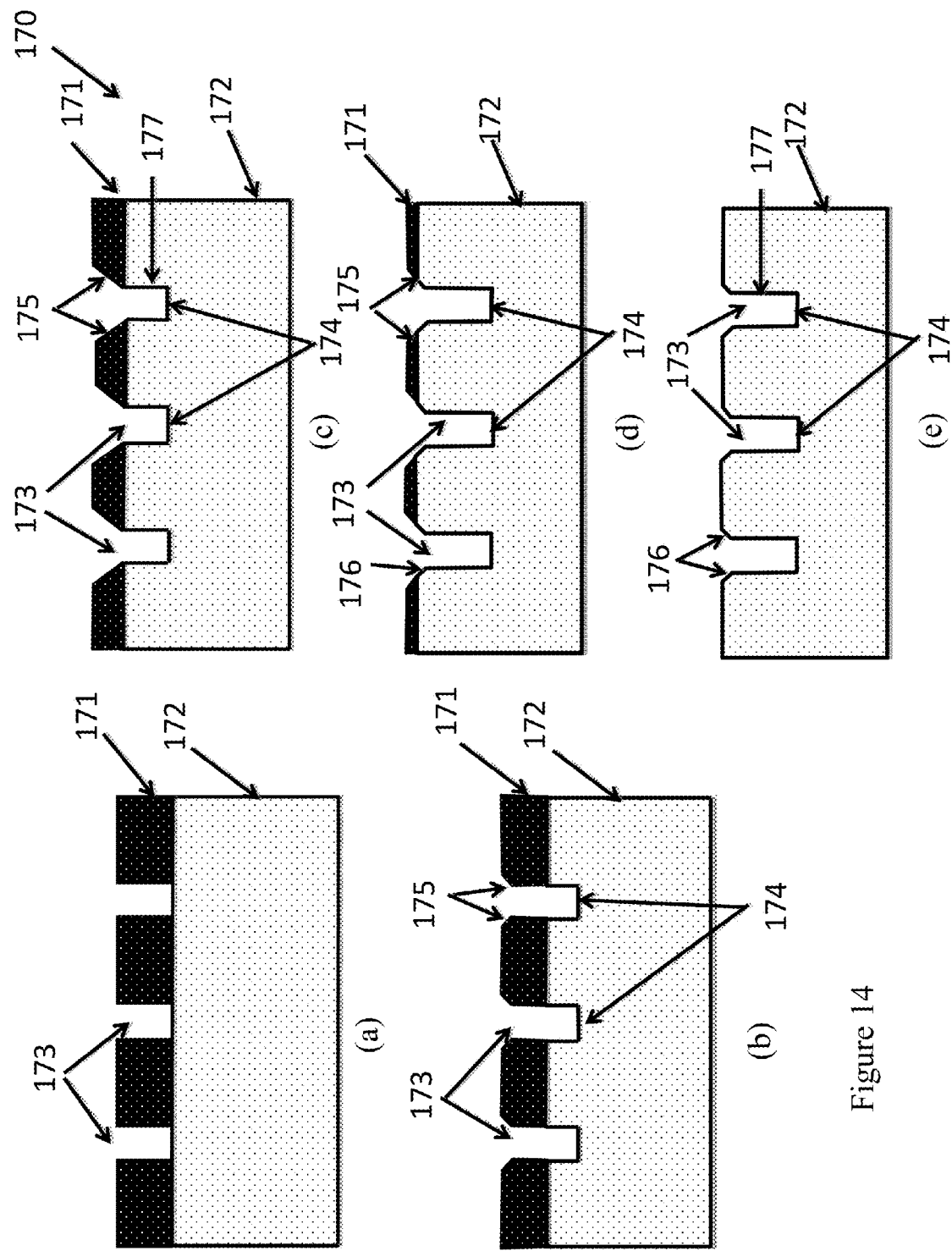
FIGS. 14a-14e are an illustration of the mechanism involved in the formation of facets of the un-etched features as described herein.

The amount of faceting of the etched silicon carbide material is directly related to the erosion of the hard mask. FIGS. 14a-14e are an illustration of a cross section 170 of a portion of a series of trenches 173 etched in a silicon carbide material substrate 172 that explains this phenomenon by showing a cross sections 170 of a series of trenches 173 of a substrate of silicon carbide 172 with a patterned etch mask 171 on the surface of the silicon carbide substrate 172 with exposed areas 173 in the etch mask 171. These series of cross sections 170 in FIGS. 14a through 14e of the substrate 172 are at different points in time as the etch in the substrate 172 is performed. FIG. 14*a* shows the substrate 172 before the etch has begun. On the surface of the substrate 172 there is a patterned etch mask 171 on a silicon carbide substrate 172 with openings 173 exposing the substrate surface 172 and where the substrate 172 can be etched. As the etching begins, as shown in FIG. 14*b*, an approximately 45-degree slant or slope 175 will be created at the edge of the hard mask 171 open features 173. This is a result of the etch mask 171 distorting the electrical field lines impinging on the etch mask 171 on the substrate surface 172, thereby effectively causing increased ion bombardment onto the exposed etch mask 171 corners that erodes the corners 175 faster than the areas surrounding the etch mask 171. This approximately 45-degree taper 175 continues to grow as the etch proceeds and the trench 174 features get deeper. As illustrated in FIG. 14*c*, eventually the 45-degree taper 175 grows to the point where it starts to intersect with the sidewalls 177 of the etched trench features 173 in the silicon carbide substrate 172. As the 45-degree taper 175 continues beyond the edge of the open trench 173 and into the silicon carbide, it begins to propagate into the top edge of the silicon carbide trench 176, as shown in FIG. 14*d*. Once the etch has been completed and the etch mask 171 has been removed, the faceting 176 that has been made at the top of the sidewalls 177 of the trenches 173 made in the silicon carbide substrate 172 are now permanent as shown in FIG. 14*e*.

Importantly, if the thickness of the etch mask 171 is sufficiently thick or the mask selectively is sufficiently high, then the edge of the 45-degree taper 175 does not reach the top edge of the trench 173 during the etch time and no top-hat facet 176 will be formed at the top of the sidewalls 177.

The calculation for the etch mask 171 thickness required to avoid the formation of the faceting 176 is as follows. If it is assumed a near vertical etch mask 171 sidewall is started with and that the facet angle 176 formed in the etch mask 171 material is 45 degrees, which is what is experimentally observed, the etch mask 171 thickness required to prevent the facet (top hat) 176 from forming in the etched features 173 in the silicon carbide substrate 172 is simply two times the etch mask 171 thickness removed during the etch. So, if, for instance it is desired to etch features having a depth 174 of 100 microns into silicon carbide substrate 172, in which the mask selectivity is 20:1, it can be calculated that the etch mask 171 must be at least 5 microns in thickness to have any etch mask 171 remaining at the end of the etch to this depth 174 and the thickness of the etch mask 171 must be at least 10 microns to avoid the faceting 176, or in general:

Thickness of Etch Mask>2*(Etch Depth/Mask Selectivity).

Figure 15:
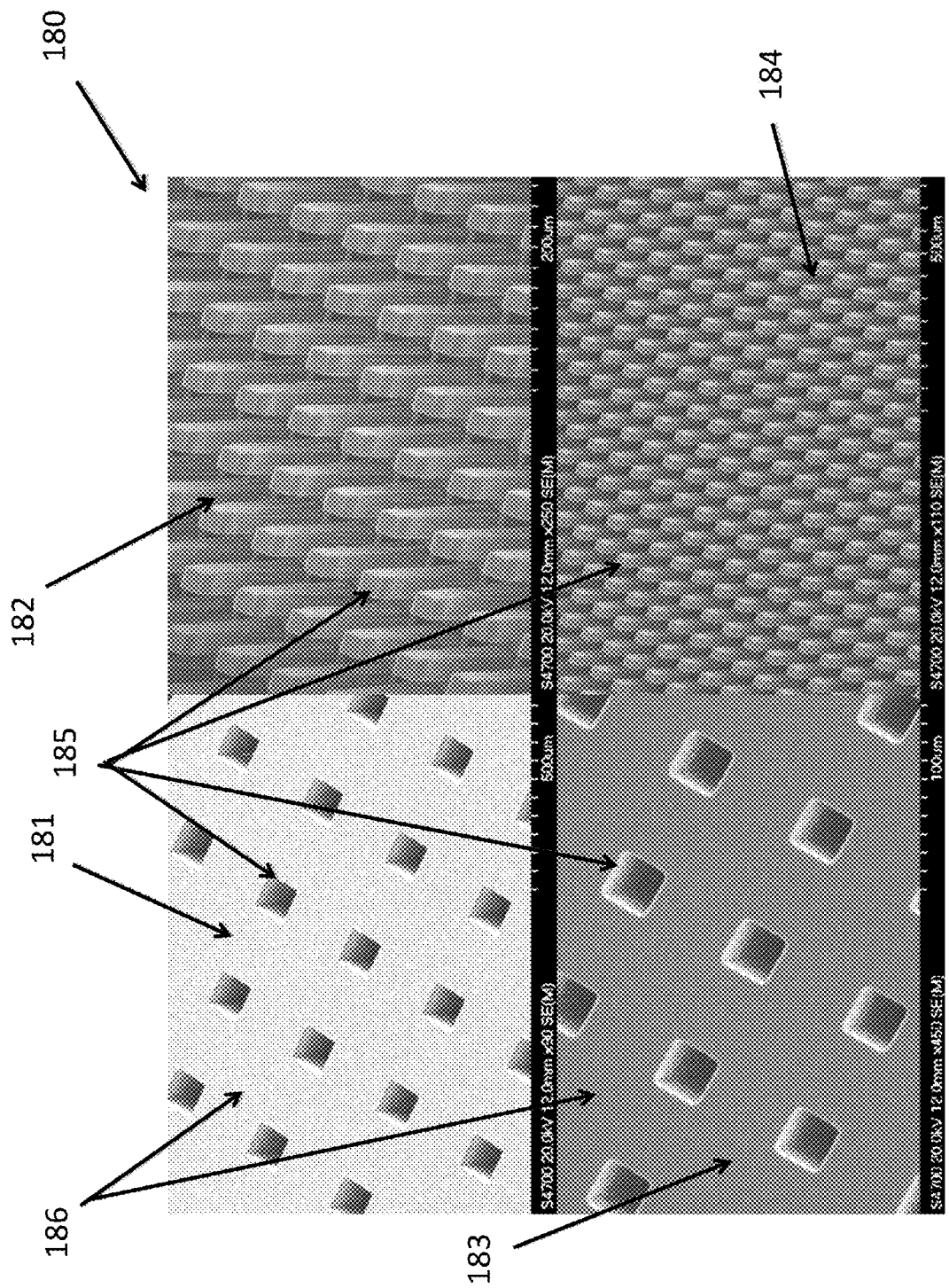
FIG. 15 is a scanning electron microscopy (SEM) image illustrating the result of the etch in making posts and vias in substrates, according to the present invention.

FIG. 15 is a series of four Scanning Electron Microscope (SEM) images 180 in four quadrants, 181, 182, 183, and 184, showing etched features 185 into a silicon carbide substrate 186. The top of the unetched portion of the silicon carbide substrate 186 is where an etch mask was located that was removed prior to these images 180 being taken. As can be seen, quadrant 1 in the top left corner 181 is a series of vias or holes having edge dimensions of 50 microns that are etched into the silicon carbide substrate 186, quadrant 2 in the top right corner 182 is a series of posts or pillars having edge dimensions of 25 microns that are etched into the silicon carbide substrate 186, quadrant 3 in the bottom left corner 183 is a series of vias or holes having edge dimensions of 25 microns that are etched in the silicon carbide substrate 186, and quadrant 4 in the bottom right 184 is a series of posts or pillars having edge dimensions of 25 microns that are etched into the silicon carbide substrate 186. These images illustrate how the etch of the present invention can be used to make deep, high-aspect features having a variety of sizes and shapes in silicon carbide material layers and/or substrates 186.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of making deep, high-aspect ratio features into a first material substrate comprised of silicon carbide, the method comprising the steps of:
    selecting a first material substrate of a predetermined thickness;
    positioning the first material substrate on a chuck disposed in a pressure controlled chamber;
    fabricating a predetermined etch mask material layer on the surface of the first material substrate of a predetermined thickness, wherein the etch mask material layer has a predetermined pattern of the features to be etched in the first material substrate; and,
    performing an Inductively-Coupled Plasma (ICP) etch into exposed regions of the first material substrate to a predetermined depth of 3.5 microns or greater, wherein the ICP etch employs (1) Sulfur Hexafluoride (SF6) as a process gas, (2) a Radio Frequency (RF) coil, positioned outside of and encircling the pressure controlled chamber, that enables generation of plasma inside the chamber and (3) and electromagnetic neutral loop comprising a set of independently controlled magnetic coils, positioned outside of and encircling the pressure controlled chamber, wherein currents in each of the coils are independently controlled so as to create an adjustable magnetic field inside the pressure controlled chamber to enable spatial redistribution of etching ions in the plasma, and performing the ICP etch includes controlling the RF coil to provide a RF electromagnetic field inside the chamber to control generation of the plasma inside the chamber and independently controlling each of the magnetic coils to spatially redistribute the etching ions in the plasma to increase etching uniformity across the first material substrate, wherein the ICP etch is performed into the exposed regions of the first material substrate while actively cooling a backside of the first material substrate positioned on the chuck by controlling a flow of Helium gas in a central cavity of the chuck positioned below the first material substrate using an inlet and outlet coupled to the central cavity, wherein at least a portion of the central cavity is formed by a portion of the first material substrate.

2. The method of claim 1, wherein the first material substrate is comprised of silicon carbide having a thickness of between 3.5 microns and several millimeters.

3. The method of claim 1, wherein the first material substrate is comprised of silicon carbide that is completely a single crystal, has some crystal structure, or is amorphous.

4. The method of claim 1, wherein the silicon carbide is 3C (zinc blende [cubic]), 4H (hexagonal), or 6H (hexagonal).

5. The method of claim 1, wherein the first material substrate is mostly comprised of silicon carbide material having any type or amount of additives incorporated in the silicon carbide material.

6. The method of claim 1, wherein the RF coil is controlled to operate at a frequency to 13.56 MHz to create the electromagnetic field within the chamber where the etching is performed.

7. The method of claim 1, wherein the Inductively-Coupled Plasma (ICP) etch system further includes a separate Radio Frequency (RF) generator connected to the chuck on which the first material substrate is positioned during etching, and wherein performing the ICP etch includes controlling the separate Radio Frequency (RF) generator to obtain a high plasma density and high levels of etch anisotropy in the first material substrate.

8. The method of claim 7 wherein the separate Radio Frequency (RF) generator is controlled to generate electromagnetic field applied to the chuck having a frequency of 13.56 MHz.

9. The method of claim 1, wherein the magnetic coils have independently controlled direct currents to generate magnetic fields enabling spatial redistribution of the etching ions in the plasma to enhance uniformity, mask selectivity, and quality of the etch into the first material substrate.

10. The method of claim 1, wherein the etch process uses Sulfur Hexafluoride ($SF_6$) as reactive gas for the plasma that is used to etch the first material substrate.

11. The method of claim 1, wherein oxygen gas is added to the plasma to modify the etch rate, mask selectivity, and anisotropy of the etched features in the first material substrate, and wherein anisotropy is verticality and shape of sidewalls.

12. The method of claim 1, wherein the depth of the etch in the first material substrate is between 10 microns to 1 millimeter.

13. The method of claim 1, wherein the depth of the etch in the first material substrate is less than 10 microns.

14. The method of claim 1, wherein the depth of the etch in the first material substrate is more than 1 millimeter.

15. The method of claim 1, wherein the aspect ratio of the etched features in the first material substrate is between 1 to 1 and 10 to 1.

16. The method of claim 1, wherein the etch in the first material substrate has aspect ratio of less than 1 to 1.

17. The method of claim 1, wherein the etch in the first material substrate has aspect ratio of more than 10 to 1.

18. The method of claim 1, wherein the etch mask material layer is comprised of a metal, semiconductor, or ceramic material layer.

19. The method of claim 18, wherein the etch mask material layer is comprised of one or more metals selected from the group consisting of copper, nickel, gold, brass, silver, titanium, platinum, tantalum, tungsten, molybdenum, and chrome.

20. The method of claim 19, wherein the etch mask material layer comprised of copper has a ratio of the etch rate of the first material substrate to the etch rate of copper larger than 100.

21. The method of claim 20, wherein the etch mask material layer comprised of copper has a negligible etch rate.

22. The method of claim 18, wherein the etch mask material layer is made of one of more ceramics selected from the group consisting of alumina; tungsten carbide; and chromium carbide.

23. The method of claim 1, wherein an etch recipe is used for etching the first material substrate, the etch recipe being comprised of a Radio Frequency (RF) bias power of between 50 and 400 Watts, a chuck temperature of between −5 and 20 degrees Celsius, an Oxygen (O2) gas flow rate of between 0 and 20 standard cubic centimeters per minute (sccm), a etch chamber gas pressure of between 1 and 15 milliTorr, a Sulfur Hexafluoride ($SF_6$) gas flow rate of between 50 and 150 standard cubic centimeters per minute (sccm), and a Radio Frequency (RF) antenna power to create the plasma of between 1500 and 2500 Watts.

24. The method of claim 23, wherein the etch recipe having a top magnet current of between 4 and 8 Amps, a center magnet current of 8 and 12 Amps, and a bottom magnet current of between 4 and 8 Amps.

25. The method of claim 23, wherein the etch recipe having a heat shield temperature of between 100 and 200 degrees-Celsius, and a Helium gas substrate cooling pressure of between 2 and 20 Pascals.

26. The method of claim 23, wherein the etch recipe is used for etching the first material substrate, the etch recipe being composed of a Radio Frequency (RF) bias power of between 90 and 110 Watts, a chuck temperature of between 10 and 14 degrees Celsius, an Oxygen (O2) gas flow rate of between 8 and 12 standard cubic centimeters per minute (sccm), an etch chamber gas pressure of between 4 and 6 milliTorr, a Sulfur Hexafluoride ($SF_6$) gas flow rate of between 80 and 120 standard cubic centimeters per minute (sccm), and a Radio Frequency (RF) antenna power to create the plasma of between 1900 and 2100 Watts.

27. The method of claim 26, wherein the etch recipe using a top magnet current of between 5.9 and 6.3 Amps, a center magnet current of 10.0 and 10.2 Amps, and a bottom magnet current of between 5.9 and 6.3 Amps.

28. A method of claim 26, wherein the etch recipe using a heat shield temperature of between 100 and 200 degrees-Celsius, and a Helium gas substrate cooling pressure of between 2 and 20 Pascals.

29. The method of claim 23, wherein the etch recipe for etching the first material substrate is further comprised of an etch cycle time of between 15 and 240 minutes, and an Oxygen (O2) clean cycle time of between 30 seconds and 10 minutes.

30. The method of claim 26, wherein the etch recipe for etching the first material substrate is further comprised of an etch cycle time of between 15 and 240 minutes, and an Oxygen (O2) clean cycle time of between 30 seconds and 10 minutes.

31. The method of claim 23, wherein the average etch rate is approximately 1 micron per minute.

32. The method of claim 23, wherein the etched features have sidewalls between 88 and 92-degrees with respect to the surface of the substrate.

33. The method of claim 23, wherein the uniformity of the depth of the etched features is approximately +/−1.5%.

34. The method of claim 23, wherein there are no etch defects in the etch features at the conclusion of the etch process.

35. The method of claim 1, wherein dimensions of openings in the etch mask material layer on the first material substrate, where the etch mask material layer functions as the etch mask, have identical or nearly identical widths across the substrate.

36. The method of claim 1, wherein walls inside an etch chamber are periodically cleaned.

37. The method of claim 1, wherein walls inside an etch chamber are mechanically scrubbed with an abrasive pad, wiped down with a solvent, and have an oxygen plasma clean performed between every substrate etch.

38. The method according to claim 1 wherein argon gas is added to the plasma to modify the etch rate, mask selectivity, and anisotropy of the etched features in the first material substrate, and wherein the anisotropy is verticality and shape of sidewalls.

39. The method according to claim 38 in which the argon flow rate is between 0 and 50 standard cubic centimeters per minute (sccm).

40. The method of claim 19, wherein a third material layer comprised of copper is used as an etch mask, the third material having a thickness less than one micron thereby affording the capability for more precise dimensional control of the etch mask features as well as the etched features, which is a high-fidelity reverse representation of the etch mask.

41. The method of claim 1, wherein the method of making deep, high-aspect ratio features into the first material substrate comprised of silicon carbide is used in the fabrication of one or more devices from one or more of the technologies including: electronics, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from silicon carbide.

42. A method of making deep, high-aspect ratio features into a first material layer comprised of silicon carbide, the method comprising the steps of:
  selecting a second material substrate of a predetermined thickness;
  positioning the second material substrate on a chuck disposed in a pressure controlled chamber;
  fabricating the first material layer of a predetermined thickness on top of the second material substrate;
  fabricating a third material layer of a predetermined thickness on a surface of the first material layer, the third material layer functioning as an etch mask and having a pre-determined pattern of features to be etched in the first material layer; and
  performing an Inductively-Coupled Plasma (ICP) etch into exposed regions of the first material layer to a predetermined depth of 3.5 microns or greater, wherein the ICP etch employs (1) Sulfur Hexafluoride ($SF_6$) as a process gas, (2) a Radio Frequency (RF) coil, positioned outside of and encircling the pressure controlled chamber, that enables generation of plasma inside the chamber and (3) an electromagnetic neutral loop comprising a set of independently controlled magnetic coils, positioned outside of and encircling the pressure controlled chamber, wherein currents in each of the coils are independently controlled so as to create an adjustable magnetic field inside the pressure controlled chamber to enable spatial redistribution of etching ions in the plasma, and performing the ICP etch includes controlling the RF coil to provide a RF electromagnetic field inside the chamber to control generation of the plasma inside the chamber and independently controlling each of the magnetic coils to spatially redistribute the etching ions in the plasma to enhance uniformity, mask selectivity, and quality of the etch into the first material layer, wherein the ICP etch is performed into the exposed regions of the first material layer while actively cooling a backside of the second material substrate positioned on the chuck by controlling a flow of Helium gas in a central cavity to the chuck positioned below the second material substrate using an inlet and outlet coupled to the central cavity, wherein at least a portion of the central cavity is formed by a portion of the first material substrate.

43. The method of claim 42, wherein the first material layer is comprised of the silicon carbide having a thickness of between 3.5 microns and several millimeters.

44. The method of claim 42, wherein the first material layer comprised of the silicon carbide that is completely a single crystal, is partially a crystal structure, or is amorphous.

45. The method of claim 42, wherein the silicon carbide is 3C (zinc blende [cubic]), 4H (hexagonal), or 6H (hexagonal).

46. The method of claim 42, wherein the first material layer is comprised of the silicon carbide material having any type or amount of additives incorporated in the silicon carbide material.

47. The method of claim 42, wherein the RF coil is controlled to operate at a frequency of 13.56 MHz to create an electromagnetic field within the chamber where the etching of the first material layer is performed.

48. The method of claim 42, wherein the Inductively-Coupled Plasma (ICP) etch system further includes a separate Radio Frequency (RF) generator connected to the chuck on which the second material substrate having the first material layer on top of the second material substrate is positioned during etching of the first material layer, and wherein performing the ICP etch includes controlling the separate Radio Frequency (RF) generator to obtain a high level of etch anisotropy in the first material layer.

49. The method of claim 48, wherein the separate Radio Frequency (RF) generator is controlled to generate electromagnetic field applied to the chuck having a frequency of 13.56 MHz.

50. The method of claim 42, wherein the magnetic coils have independently controlled direct currents to generate magnetic fields enabling spatial redistribution of the etching ions in the plasma to enhance uniformity, mask selectivity, and quality of the etch into the first material layer.

51. The method of claim 42, wherein the etch process uses Sulfur Hexafluoride ($SF_6$) as a reactive gas for a plasma that is used to etch the first material layer.

52. The method of claim 42, wherein oxygen gas is added to the plasma to modify the etch rate, mask selectivity, and anisotropy of the etched features in the first material layer, and wherein anisotropy is verticality and shape of sidewalls.

53. The method of claim 42, wherein the depth of the etch in the first material layer is between 1 micron to 1 millimeter.

54. The method of claim 42 wherein the depth of the etch in the first material layer is less than 1 micron.

55. The method of claim 42, wherein the depth of the etch in the first material layer is more than 1 millimeter.

56. The method of claim 42, wherein the etch features in the first material layer have an aspect ratio of between 1 to 1 and 10 to 1.

57. The method of claim 42, wherein the etch in the first material layer has an aspect ratio of less than 1 to 1.

58. The method of claim 42, wherein the etch in the first material layer has an aspect ratio of more than 10 to 1.

59. The method of claim 42, wherein the etch mask third material layer is comprised of a metal, semiconductor or ceramic material layer.

60. The method of claim 59, wherein the etch mask third material layer is comprised of one or more metals selected from a group consisting of copper, nickel, gold, brass, silver, titanium, platinum, tantalum, tungsten, molybdenum, and chrome.

61. The method of claim 60, wherein the etch mask third material layer comprised of the copper has a ratio of the etch rate of the first material layer to the etch rate of copper larger than 100.

62. The method of claim 61, wherein the etch mask third material layer is comprised of the copper and has a negligible etch rate.

63. The method of claim 59, wherein the etch mask third material layer is made of one or more ceramic materials selected from the group consisting of alumina; tungsten carbide; and chromium carbide.

64. The method of claim 42, wherein the second material substrate is comprised of a metal, semiconductor, silicon dioxide, or ceramic material layer.

65. The method of claim 64, wherein the second material substrate is comprised of one or more silicon dioxide materials selected from the group consisting of fused silica, glass, quartz, fused quartz, borosilicate glass, and any material type, the majority of which is comprised of silicon dioxide.

66. The method of claim 64, wherein the second material substrate is comprised of one or more ceramics selected from the group consisting of aluminum oxide, alumina, titanium nitride, tungsten carbide; chromium carbide; and any known ceramic material in either single crystal or polycrystalline form.

67. The method of claim 64, wherein the second material substrate is made of one or more semiconductor materials selected from the group consisting of silicon, germanium, gallium arsenide; gallium nitride; lithium niobate; and any known semiconductor material in either single crystal or polycrystalline form.

68. The method of claim 64, wherein the second material substrate is made of one or more metals selected from the group consisting of copper, stainless steel, nickel, tungsten, brass, chrome; or titanium, and a combination of such metals that have been laminated or alloyed together, either in single crystal or polycrystalline form.

69. The method of claim 42, wherein an etch recipe is used for etching the first material layer, the etch recipe comprising of a Radio Frequency (RF) bias power of between 50 and 400 Watts, a chuck temperature of between −5 and 20 degrees Celsius, an Oxygen (O2) gas flow rate of between 0 and 20 standard cubic centimeters per minute (sccm), an etch chamber gas pressure of between 1 and 15 milliTorr, a Sulfur Hexafluoride (SF$_6$) gas flow rate of between 50 and 150 standard cubic centimeters per minute (sccm), and a Radio Frequency (RF) antenna power to create the plasma of between 1500 and 2500 Watts.

70. The method of claim 69, wherein the etch recipe having a top magnet current of between 4 and 8 Amps, a center magnet current of 8 and 12 Amps, and a bottom magnet current of between 4 and 8 Amps.

71. The method of claim 69, wherein the etch recipe having a heat shield temperature of between 100 and 200 degrees-Celsius, and a Helium gas substrate cooling pressure of between 2 and 20 Pascals.

72. The method of claim 69, wherein the etch recipe is used for etching the first material layer, the etch recipe being composed of a Radio Frequency (RF) bias power of between 90 and 110 Watts, a chuck temperature of between 10 and 14 degrees Celsius, an Oxygen (O2) gas flow rate of between 8 and 12 standard cubic centimeters per minute (sccm), an etch chamber gas pressure of between 4 and 6 milliTorr, a Sulfur Hexafluoride (SF$_6$) gas flow rate of between 80 and 120 standard cubic centimeters per minute (sccm), and a Radio Frequency (RF) antenna power to create the plasma of between 1900 and 2100 Watts.

73. The method of claim 72, wherein an etch recipe using a top magnet current of between 5.9 and 6.3 Amps, a center magnet current of 10.0 and 10.2 Amps, and a bottom magnet current of between 5.9 and 6.3 Amps.

74. A method of claim 72, wherein an etch recipe using a heat shield temperature of between 100 and 200 degrees-Celsius, and a Helium gas substrate cooling pressure of between 2 and 20 Pascals.

75. The method of claim 69, wherein the etch recipe for etching the first material layer is further comprised of an etch cycle time of between 15 and 240 minutes, and an Oxygen (O2) clean cycle time of between 30 seconds and 10 minutes.

76. The method of claim 72, wherein the etch recipe for etching the first material layer is further comprised of an etch cycle time of between 15 and 240 minutes, and an Oxygen (O2) clean cycle time of between 30 seconds and 10 minutes.

77. The method of claim 69, wherein the average etch rate is approximately 1 micron per minute.

78. The method of claim 69, wherein the etched features have sidewalls between 88 and 92-degrees with respect to the surface of the second material substrate.

79. The method of claim 69, wherein the uniformity of the depth of the etched features is approximately +/−1.5%.

80. The method of claim 69, wherein there are no etch defects in the etch features at the conclusion of the etch process.

81. The method of claim 42, wherein dimensions of openings in the third material layer on the first material layer, where the third material layer functions as the etch mask, have identical or nearly identical widths across the substrate.

82. The method of claim 42, wherein walls inside the chamber are periodically cleaned.

83. The method of claim 42, wherein walls inside the chamber are mechanically scrubbed with an abrasive pad, wiped down with a solvent, and have an oxygen plasma clean performed between every substrate etch.

84. The method according to claim 42 wherein argon gas is added to the plasma to modify the etch rate, mask selectivity, and anisotropy of the etched features in the first material layer, and wherein anisotropy is verticality and shape of sidewalls.

85. The method according to claim 84 in which the argon flow rate is between 0 and 50 standard cubic centimeters per minute (sccm).

86. The method of claim 42, wherein the depth of the etch performed into the first material layer completely goes through the predetermined thickness of the first material layer.

87. The method of claim 61, wherein the third material layer comprised of copper that is used as an etch mask can have a thickness less than one micron thereby affording the capability for more precise dimensional control of the etch mask features as well as the etched features, which is a high-fidelity reverse representation of the etch mask.

\* \* \* \* \*